(12) United States Patent
Oh et al.

(10) Patent No.: US 11,715,726 B2
(45) Date of Patent: *Aug. 1, 2023

(54) MEMORY DEVICE, MEMORY SYSTEM HAVING THE SAME, AND WRITE METHOD THEREOF

(71) Applicant: SK hynix Inc., Icheon-si (KR)

(72) Inventors: Sung Lae Oh, Icheon-si (KR); Ki Soo Kim, Icheon-si (KR); Sang Woo Park, Icheon-si (KR); Dong Hyuk Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/555,383

(22) Filed: Dec. 18, 2021

(65) Prior Publication Data

US 2022/0115357 A1 Apr. 14, 2022

Related U.S. Application Data

(63) Continuation of application No. 17/078,020, filed on Oct. 22, 2020, now Pat. No. 11,239,209.

(30) Foreign Application Priority Data

Jun. 8, 2020 (KR) .................. 10-2020-0068781

(51) Int. Cl.
*G11C 16/00* (2006.01)
*H01L 25/065* (2023.01)
(Continued)

(52) U.S. Cl.
CPC ...... *H01L 25/0657* (2013.01); *G11C 16/0483* (2013.01); *G11C 16/10* (2013.01);
(Continued)

(58) Field of Classification Search
None
See application file for complete search history.

(56) References Cited

U.S. PATENT DOCUMENTS 4,908,328 A * 3/1990 Hu ................... H01L 21/76251
257/370
9,748,206 B1 8/2017 Huang
(Continued)

FOREIGN PATENT DOCUMENTS

CN 109417075 A 3/2019
JP 2018-152419 A 9/2018
(Continued)

*Primary Examiner* — Tan T. Nguyen

(57) ABSTRACT

A memory device includes: a first wafer including a first substrate, a plurality of first electrode layers and a plurality of first interlayer dielectric layers alternately stacked along first vertical channels projecting in a vertical direction on a top surface of the first substrate, and a dielectric stack comprising a plurality of dielectric layers and the plurality of first interlayer dielectric layers alternately stacked on the top surface of the first substrate; and a second wafer disposed on the first wafer, and including a second substrate, and a plurality of second electrode layers that are alternately stacked with a plurality of second interlayer dielectric layers along second vertical channels projecting in the vertical direction on a bottom surface of the second substrate and have pad parts overlapping with the dielectric stack in the vertical direction.

14 Claims, 38 Drawing Sheets

(51) Int. Cl.
*H01L 23/00* (2006.01)
*G11C 16/10* (2006.01)
*G11C 16/16* (2006.01)
*G11C 16/04* (2006.01)
*H10B 43/27* (2023.01)
*H10B 43/40* (2023.01)

(52) U.S. Cl.
CPC .............. *G11C 16/16* (2013.01); *H01L 24/08* (2013.01); *H10B 43/27* (2023.02); *H10B 43/40* (2023.02); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 11,239,209 B2 * | 2/2022 | Oh | ............... G11C 16/0483 |
| 2008/0277765 A1 * | 11/2008 | Lane | ................. H01L 21/78 |
| | | | 257/E21.546 |
| 2014/0252605 A1 | 9/2014 | Ma | |
| 2017/0005076 A1 | 1/2017 | Ho | |
| 2020/0150894 A1 | 5/2020 | Lee | |
| 2020/0350321 A1 * | 11/2020 | Cheng | ............... H01L 21/02013 |
| 2021/0193613 A1 | 6/2021 | Hua | |

FOREIGN PATENT DOCUMENTS

| | | |
|---|---|---|
| KR | 10-2009-0106645 A | 10/2009 |
| KR | 10-2013-0035553 A | 4/2013 |

\* cited by examiner

FIG.5
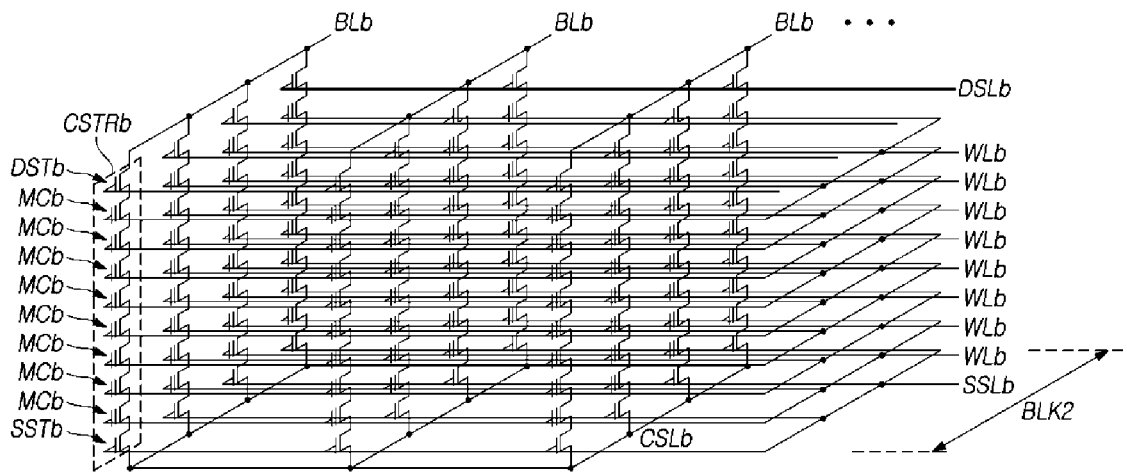
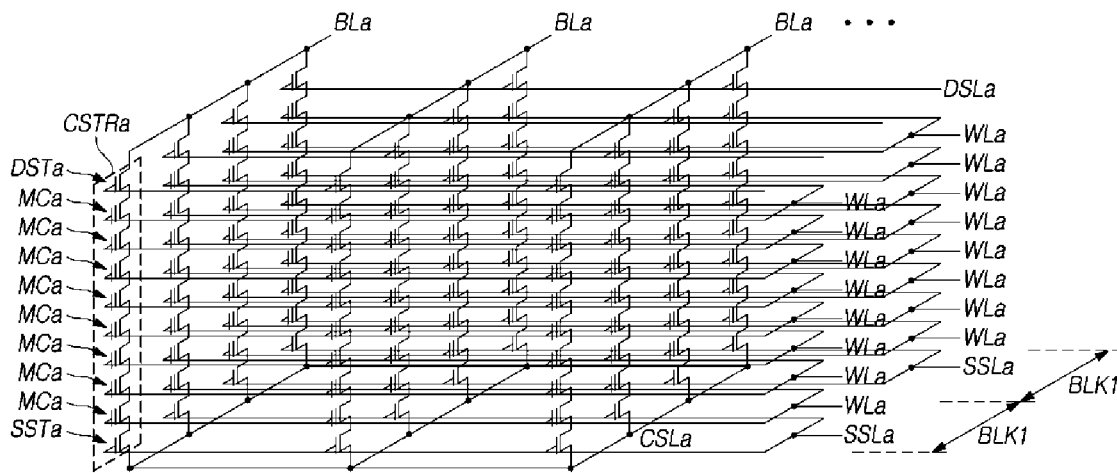
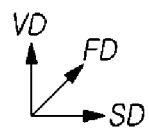

FIG.8
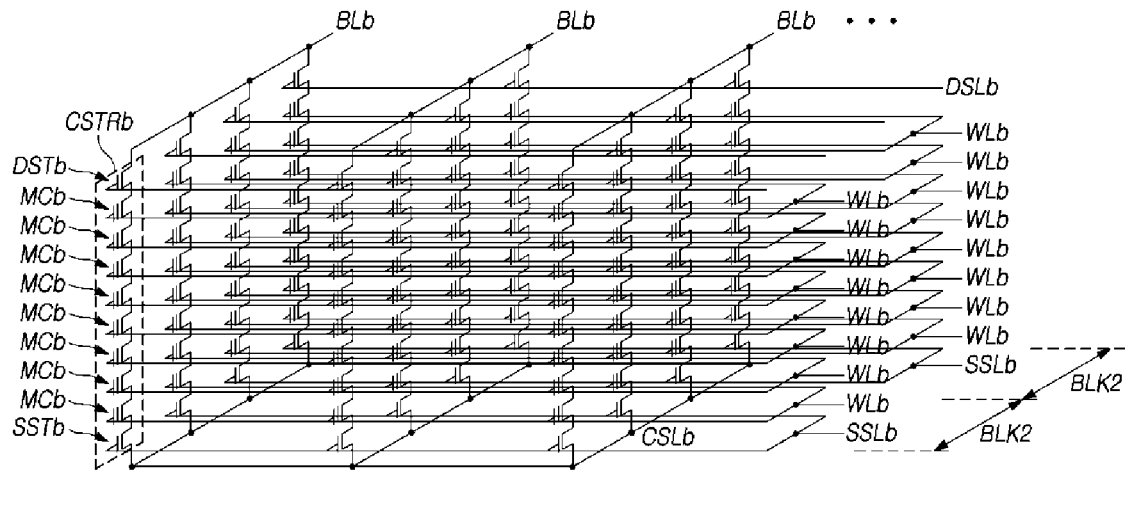
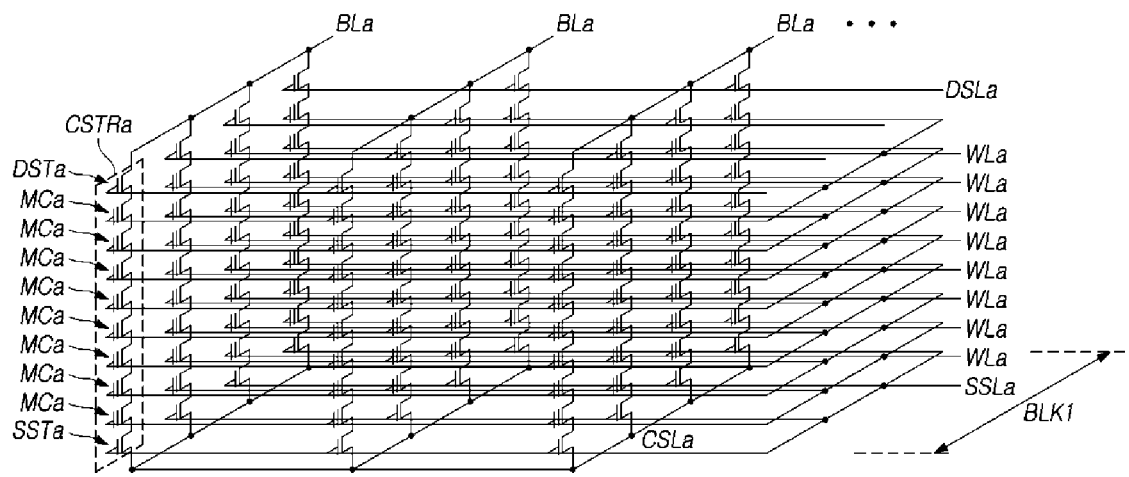
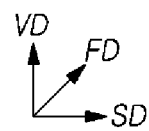

FIG.11
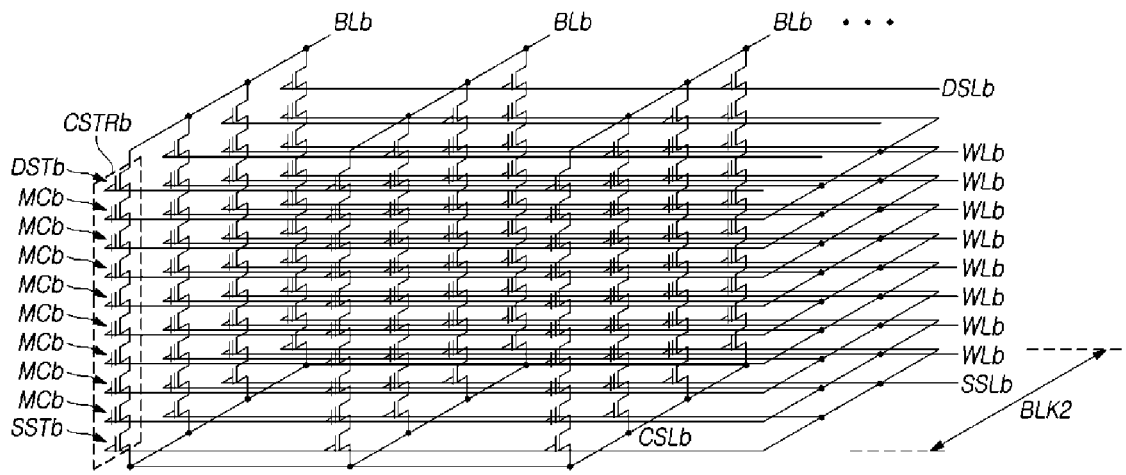
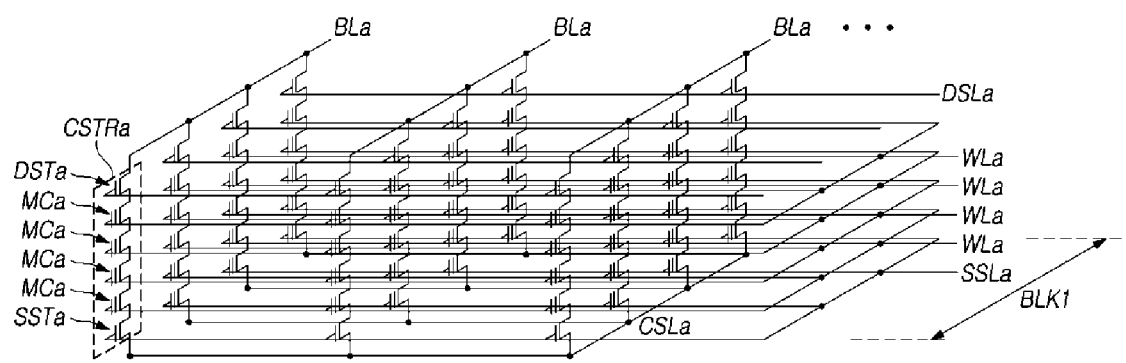
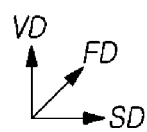

FIG.17
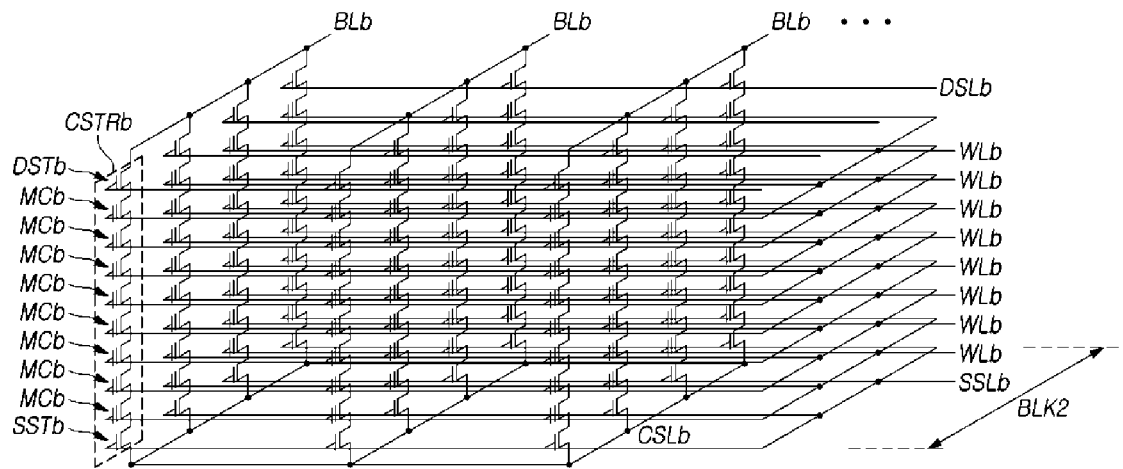
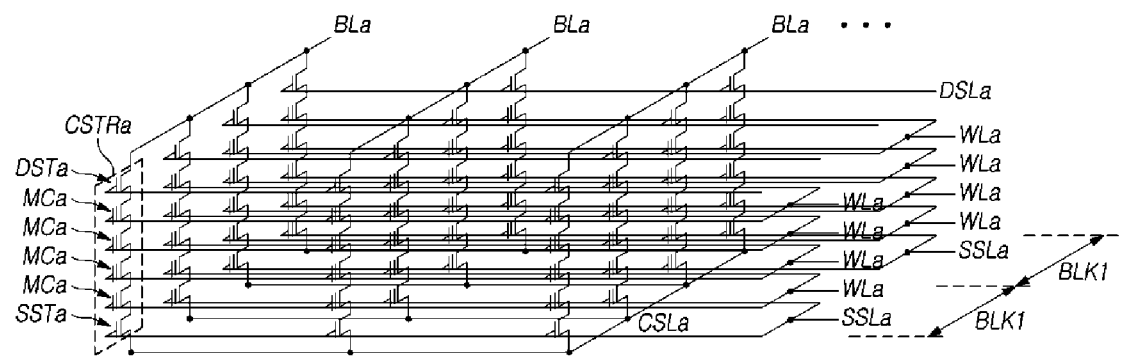
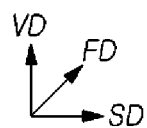

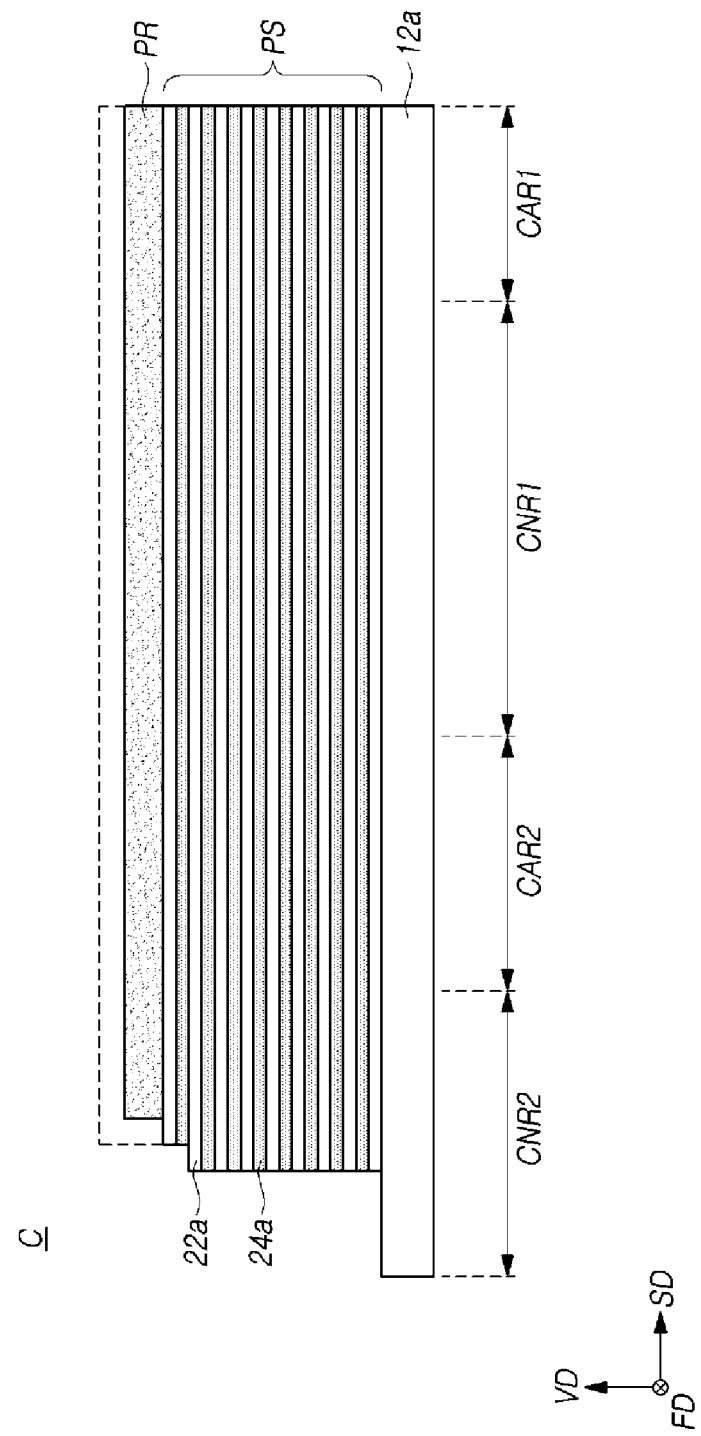

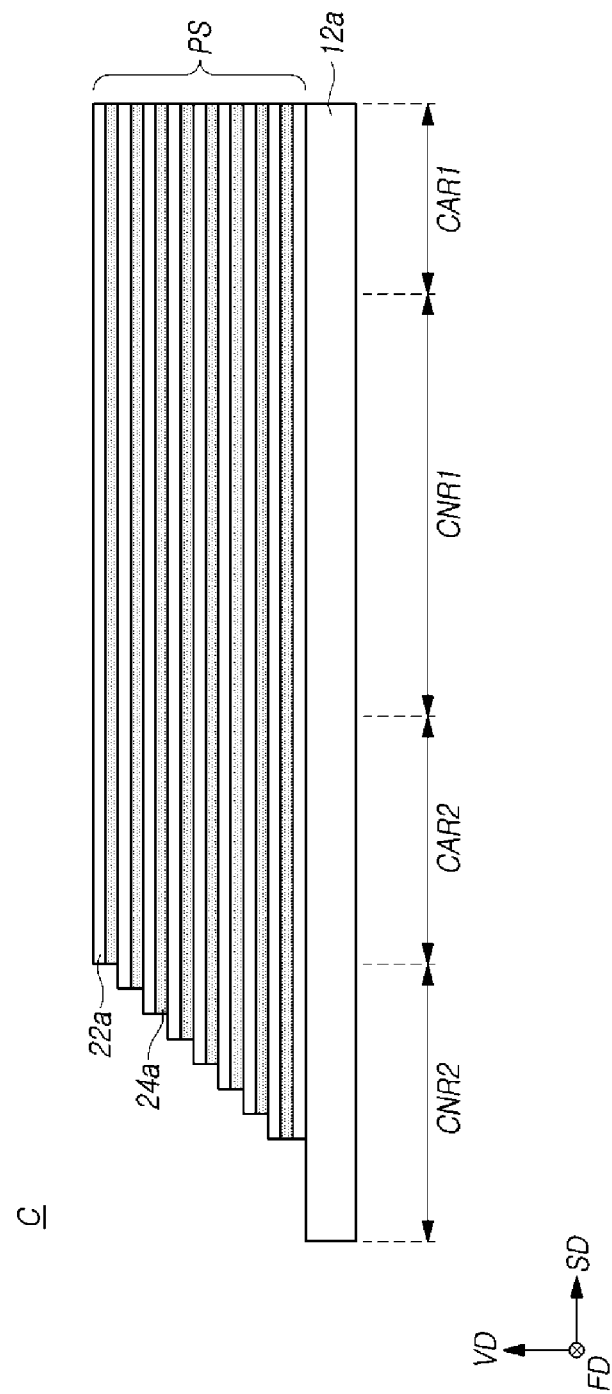

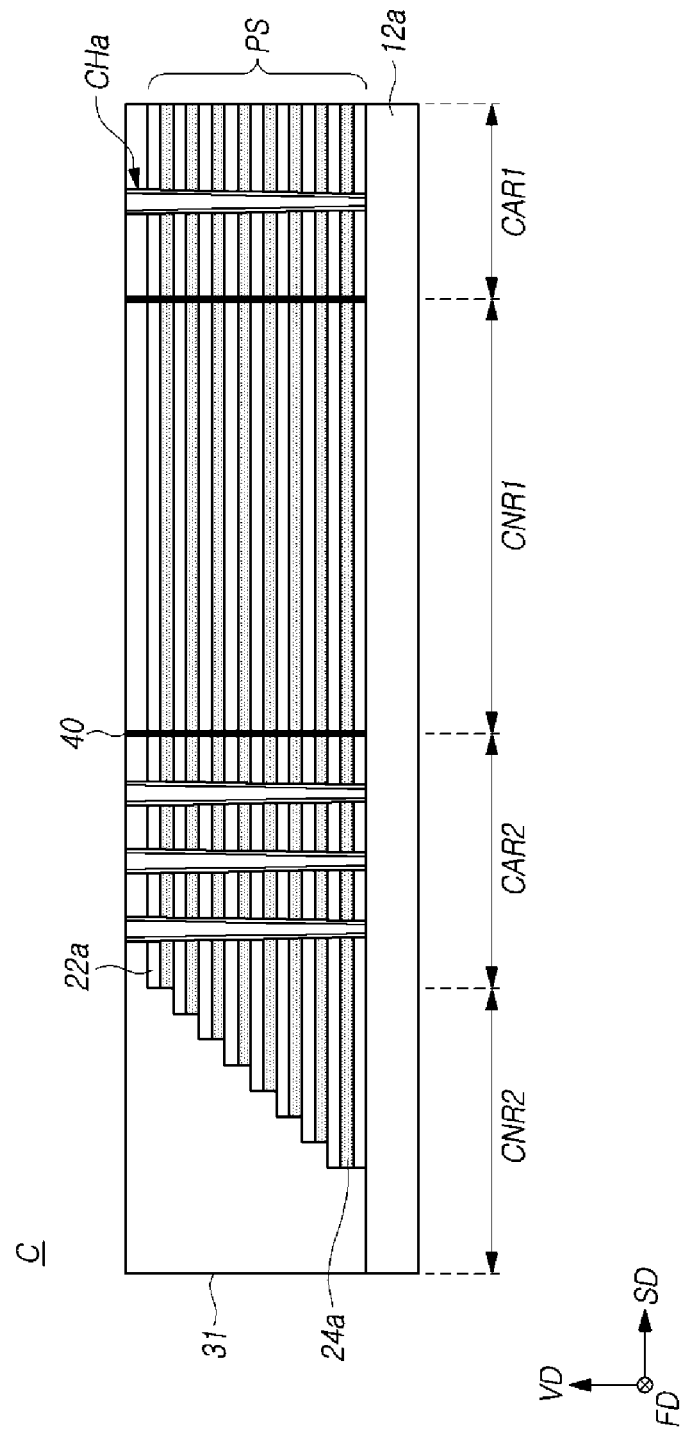

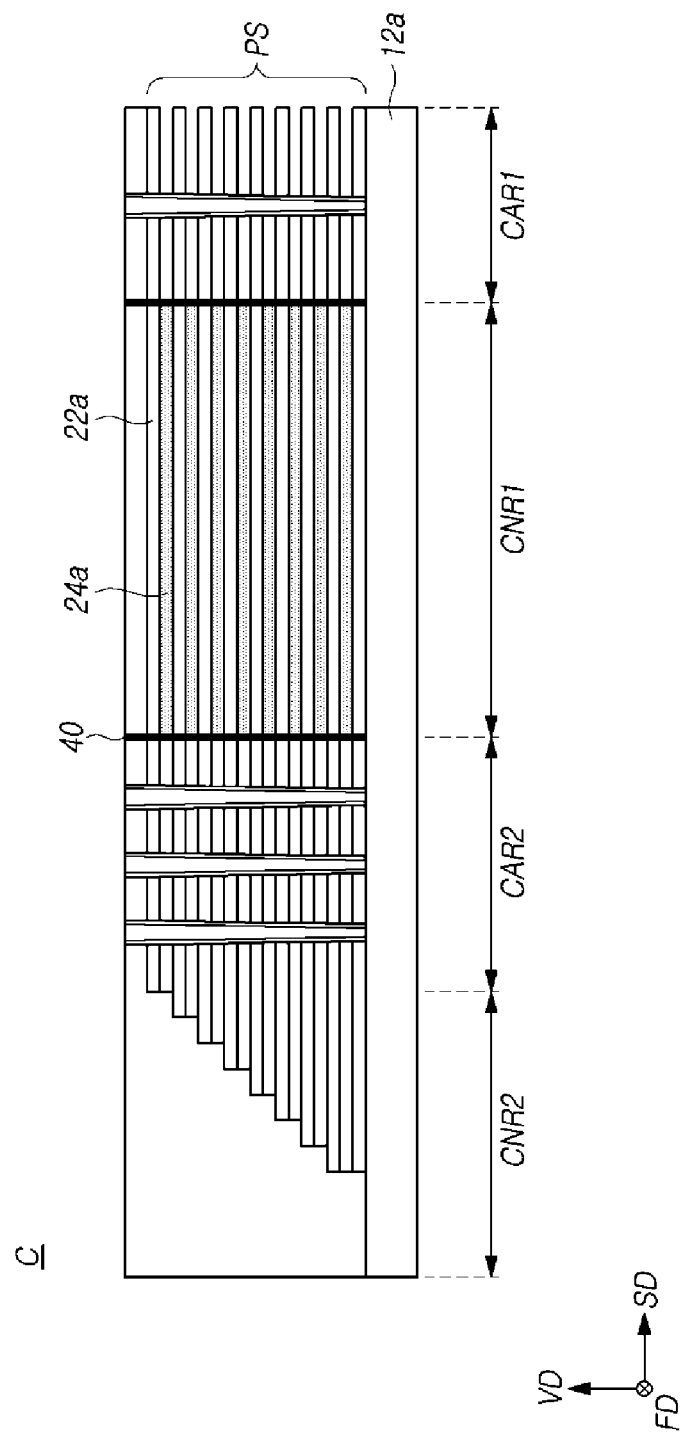

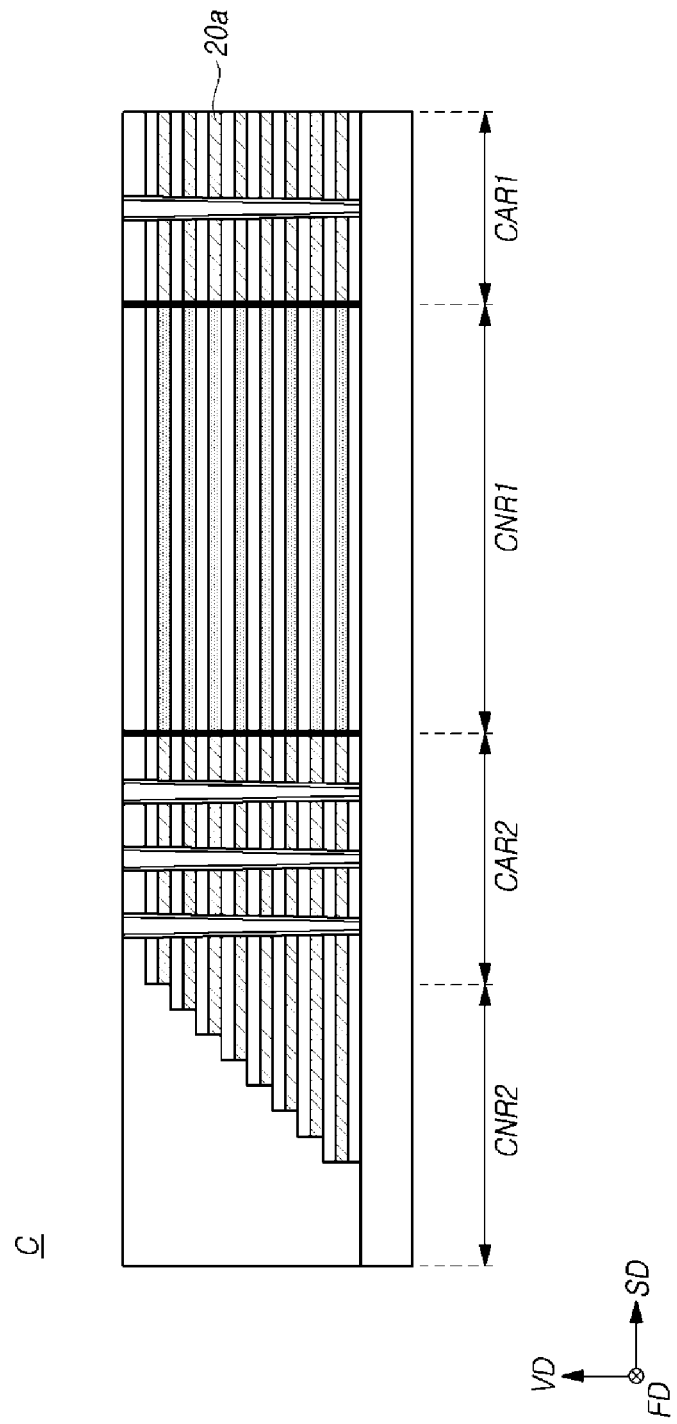

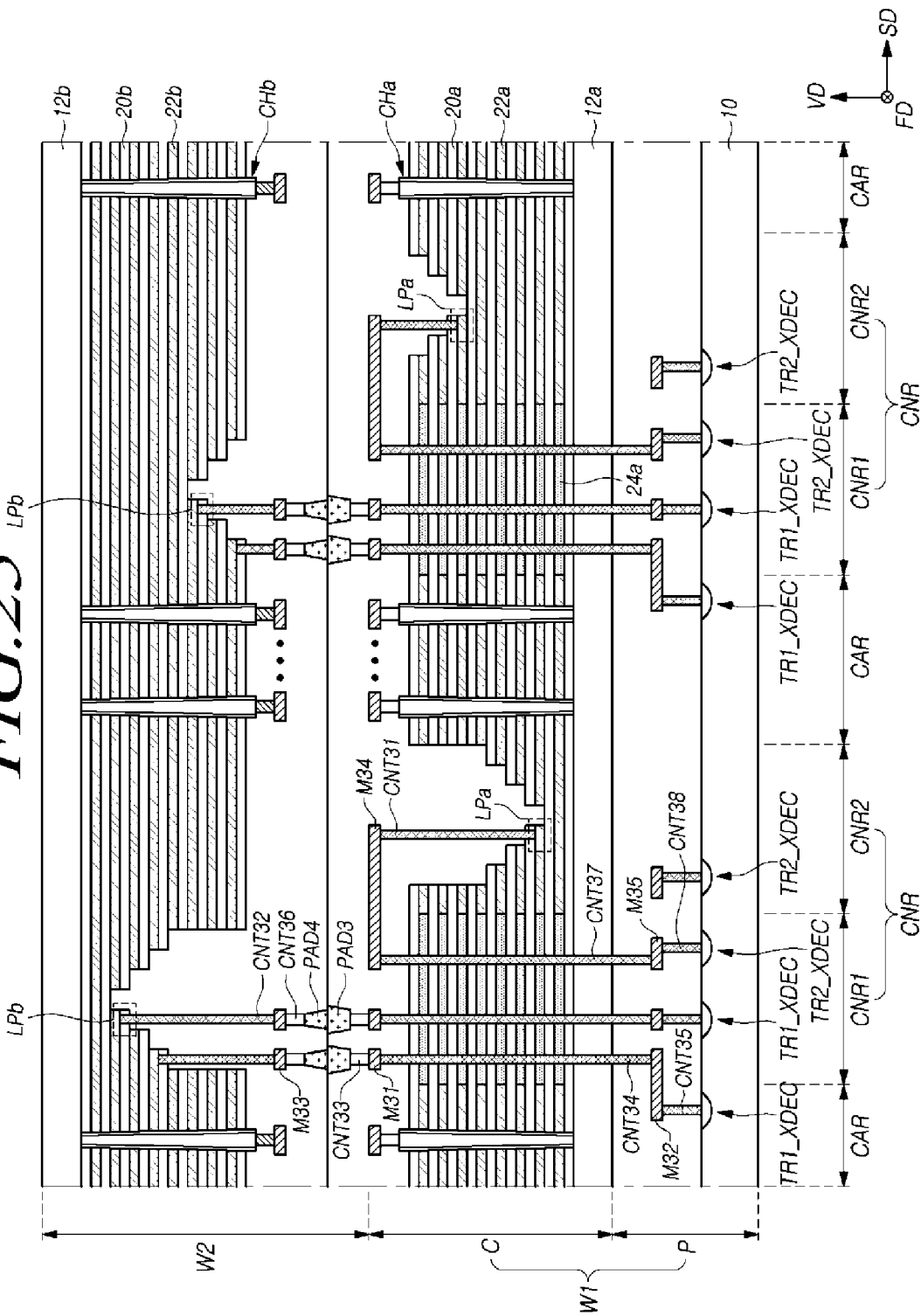

MEMORY DEVICE, MEMORY SYSTEM HAVING THE SAME, AND WRITE METHOD THEREOF

CROSS-REFERENCE TO RELATED APPLICATION

The present application is a continuation application of a U.S. patent application Ser. No. 17/078,020, filed on Oct. 22, 2020, which claims priority under 35 U.S.C. § 119(a) to Korean Patent Application No. 10-2020-0068781 filed in the Korean Intellectual Property Office on Jun. 8, 2020, which is incorporated herein by reference in its entirety.

BACKGROUND

1. Technical Field

Various embodiments generally relate to a semiconductor technology, and more particularly, to a memory device, a memory system having the same, and a write method thereof.

2. Related Art

As the demand for portable phones, mobile memory devices and digital cameras increases, the demand for nonvolatile memory devices, which are mainly used as memory devices for these products, also increases. Among nonvolatile memory devices, a flash memory device is widely used as a data storage device. Recently, in order to improve the degree of integration of a memory device, a three-dimensional nonvolatile memory device in which memory cells are three-dimensionally stacked has been actively studied.

SUMMARY

Various embodiments are directed to measures capable of improving the use efficiency of a memory.

Also, various embodiments are directed to measures capable of improving the performance of a memory.

In an embodiment, a memory device may include: a first memory block defined in a first wafer; and a second memory block defined in a second wafer that is disposed in a vertical direction with respect to the first wafer. A size of the first memory block may be smaller than a size of the second memory block.

In an embodiment, a memory device may include: a first wafer including a first substrate, and a plurality of first electrode layers and a plurality of first interlayer dielectric layers that are alternately stacked along first vertical channels projecting in a vertical direction on a top surface of the first substrate; and a second wafer disposed on the first wafer, and including a second substrate, and a plurality of second electrode layers and a plurality of second interlayer dielectric layers that are alternately stacked along second vertical channels projecting in the vertical direction on a bottom surface of the second substrate. Each of the second electrode layers may include a pad part. The first wafer may include a dielectric stack that overlaps with pad parts of the second electrode layers in the vertical direction and is configured by a plurality of dielectric layers and the plurality of first interlayer dielectric layers alternately stacked.

In an embodiment, a memory system may include: a memory device; and a memory controller. The memory device may include: a small block defined in a first wafer; and a large block defined in a second wafer, which is disposed in a vertical direction with respect to the first wafer. The memory controller may store data in the small block or the large block by referring to a size of write-requested data.

In an embodiment, a data write method of a memory device including a small block and a large block may include: receiving a write request; detecting a size of a write-requested write data; and storing the data in a small block or a large block depending on a detection result.

BRIEF DESCRIPTION OF THE DRAWINGS

FIG. 5 is a circuit diagram illustrating a representation of an example of a first memory block and a second memory block of FIG. 3.

FIG. 8 is a circuit diagram illustrating a representation of an example of the first memory block and the second memory block illustrated in FIG. 6.

FIG. 11 is a circuit diagram illustrating a representation of an example of the first memory block and the second memory block of FIG. 9.

FIG. 17 is a circuit diagram illustrating a representation of an example of the first memory block and the second memory block of FIG. 15.

FIGS. 24A to 24E are cross-sectional views illustrating representations of examples of steps of manufacturing a memory structure of the first wafer in accordance with the embodiment of the disclosure.

FIG. 25 is a cross-sectional view illustrating a representation of an example of another coupling structure between row lines and a row decoder of the memory device in accordance with the embodiment of the disclosure.

DETAILED DESCRIPTION

Figure 1:
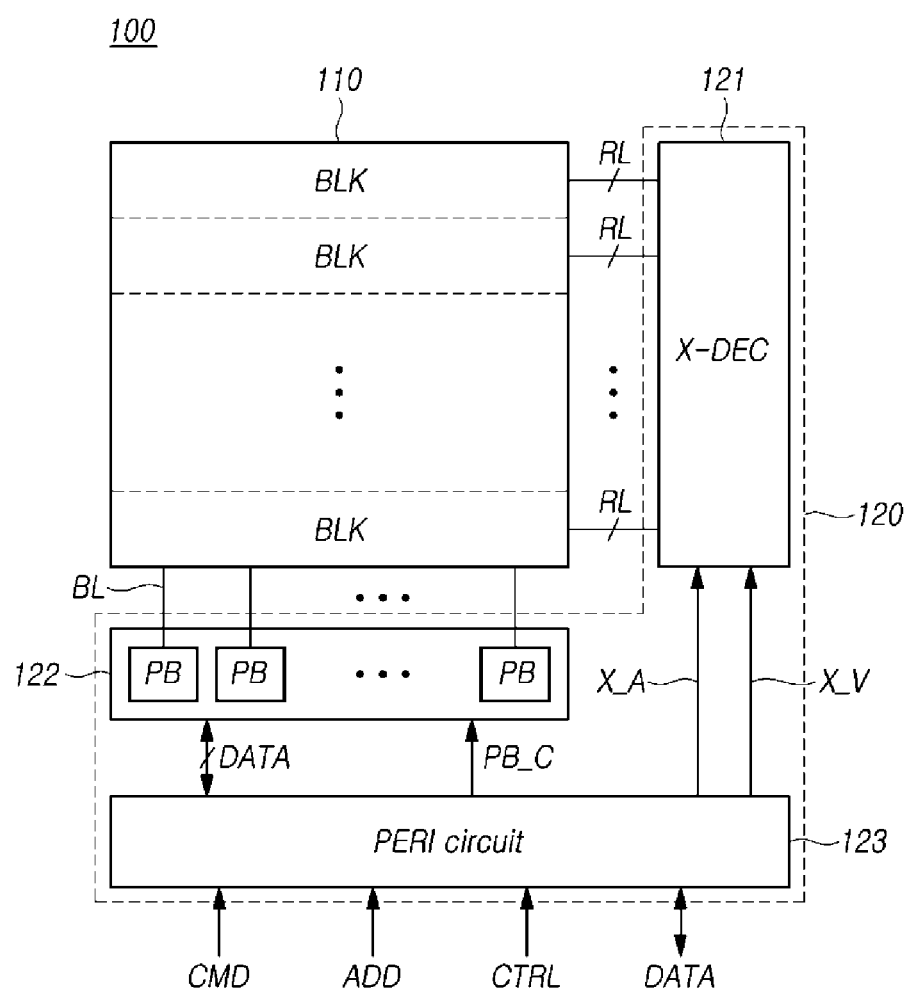
FIG. 1 is a block diagram schematically illustrating a representation of an example of a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be noticed or understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a representation of an example of a memory device 100 in accordance with an embodiment of the disclosure.

Referring to FIG. 1, the memory device 100 in accordance with the embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. The memory block BLK may include a plurality of memory cells. The memory block BLK may be coupled to the row decoder 121 through a plurality of row lines RL. The memory cell array 110 may be coupled to the page buffer circuit 122 through a plurality of bit lines BL.

The row decoder 121 may select any one among the plurality of memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the plurality of memory blocks BLK included in the memory cell array 110.

The page buffer circuit 122 may include a plurality of page buffers PB, which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL, based on the data signal DATA received from the peripheral circuit 123, in response to the page buffer control signal PB_C, and thereby, may write data in a memory cell of the memory cell array 110. The page buffer circuit 122 may write data in or read data from memory cells, which are coupled to an activated word line.

The peripheral circuit 123 may receive a command signal CMD, an address signal ADD and a control signal CTRL from outside the memory device 110, and may transmit and receive data DATA to and from a device outside the memory device 110, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the memory device 110.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of bit lines, and the second direction SD may correspond to the extending direction of row lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Figure 2:
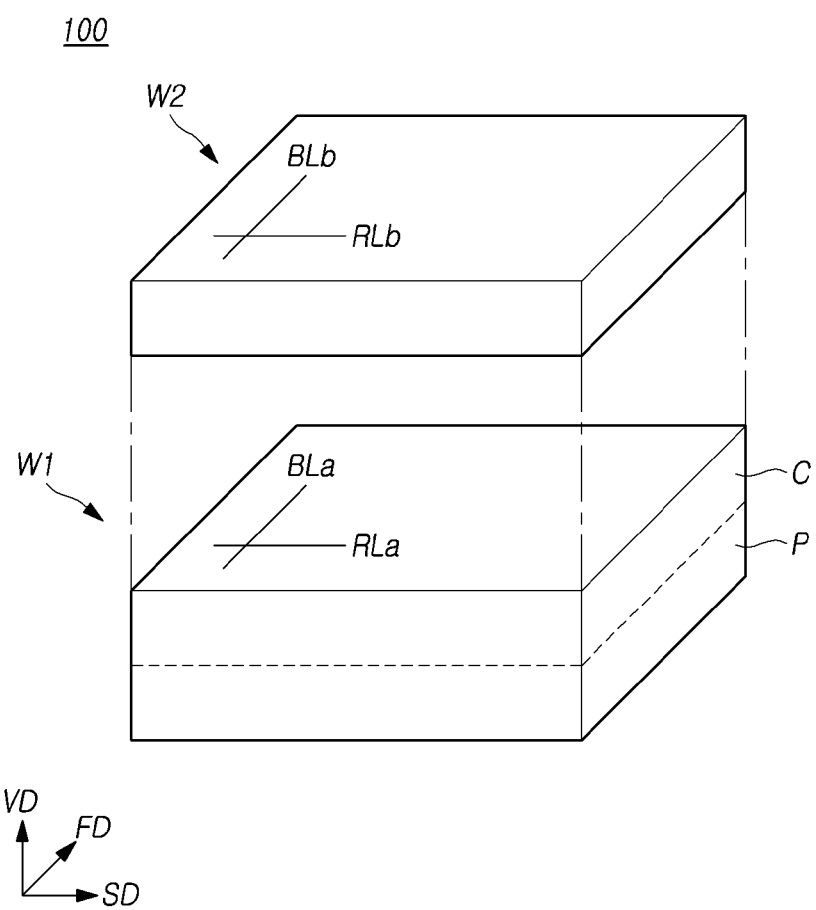
FIG. 2 is a schematic perspective view illustrating a representation of an example of the memory device illustrated in FIG. 1.

FIG. 2 is a schematic perspective view illustrating a representation of an example of the memory device illustrated in FIG. 1.

Referring to FIG. 2, the memory device 100 in accordance with an embodiment of the disclosure may include a first wafer W1 and a second wafer W2, which are disposed in the vertical direction VD and are bonded to each other. In order to facilitate understanding, FIG. 2 illustrates that the first wafer W1 and the second wafer W2 are separated from each other in the vertical direction VD, but it should be understood that the top surface of the first wafer W1 and the bottom surface of the second wafer W2 are in contact with each other.

The first wafer W1 may include a logic structure P and a memory structure C, which is stacked on the logic structure P. The logic structure P may include at least one among the row decoder 121, the page buffer circuit 122 and the peripheral circuit 123 of FIG. 1. The memory structure C may include a plurality of first memory blocks (not illustrated).

The second wafer W2 may include a plurality of second memory blocks (not illustrated). The first memory blocks of the first wafer W1 and the second memory blocks of the second wafer W2 may constitute the memory cell array 110 of FIG. 1.

A plurality of first bit lines BLa extending in the first direction FD and a plurality of first row lines RLa extending in the second direction SD may be disposed in the first wafer W1. The first memory blocks defined in the first wafer W1 may be accessed through the plurality of first bit lines BLa and the plurality of first row lines RLa. For the sake of simplicity in illustration, FIG. 2 illustrates only one first bit line BLa and only one first row line RLa, but it should be understood that the plurality of first bit lines BLa and the plurality of first row lines RLa are defined in the first wafer W1.

A plurality of second bit lines BLb extending in the first direction FD and a plurality of second row lines RLb extending in the second direction SD may be disposed in the second wafer W2. The second memory blocks defined in the second wafer W2 may be accessed through the plurality of second bit lines BLb and the plurality of second row lines RLb. For the sake of simplicity in illustration, FIG. 2 illustrates only one second bit line BLb and only one second row line RLb, but it should be understood that the plurality of second bit lines BLb and the plurality of second row lines RLb are defined in the second wafer W2.

Although not illustrated, the first and second bit lines BLa and BLb and the first and second row lines RLa and RLb may be electrically coupled to a logic circuit that is defined in the logic structure P. A coupling structure between the first and second bit lines BLa and BLb and the first and second row lines RLa and RLb and the logic circuit will become apparent through following descriptions to be made with reference to FIGS. 21 to 25.

Figure 3:
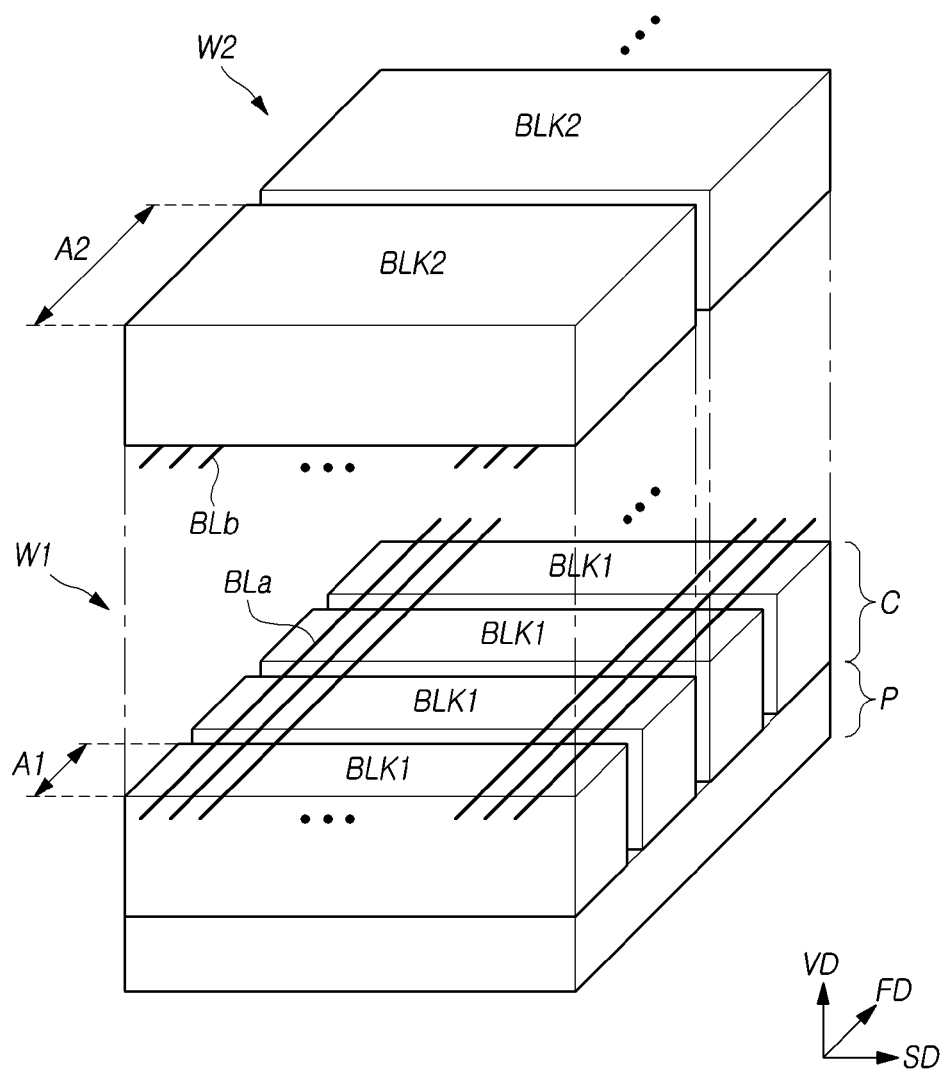
FIG. 3 is a diagram illustrating a representation of an example of a schematic disposition of a first wafer and a second wafer illustrated in FIG. 2.

FIG. 3 is a diagram illustrating a representation of an example of a schematic disposition of a first wafer and a second wafer illustrated in FIG. 2.

Referring to FIG. 3, the memory structure C of the first wafer W1 may include a plurality of first memory blocks BLK1 that are arranged in the first direction FD, which is the extending direction of a plurality of first bit lines BLa. The plurality of first memory blocks BLK1 may be coupled in common to each of the plurality of first bit lines BLa. Although not illustrated, each first memory block BLK1 may include a plurality of cell strings, which are coupled to the plurality of first bit lines BLa.

Each of the plurality of first memory blocks BLK1 may have the same size. The size of the first memory block BLK1 may be defined as the number of memory cells included in the first memory block BLK1. The number of memory cells included in the first memory block BLK1 may be proportional to the physical size of the first memory block BLK1. The physical size of the first memory block BLK1 may be defined by the width of the first memory block BLK1 in the first direction FD, the length of the first memory block BLK1 in the second direction SD, and the height of the first memory block BLK1 in the vertical direction VD. The size of the first memory block BLK1 may also be defined as the physical size of the first memory block BLK1. The size of the first memory block BLK1 may be defined as proportional to the physical size of the first memory block BLK1.

The second wafer W2 may include a plurality of second memory blocks BLK2 that are arranged in the first direction FD, which is the extending direction of a plurality of second bit lines BLb. The plurality of second memory blocks BLK2 may be coupled in common to each of the plurality of second bit lines BLb. Although not illustrated, each second memory block BLK2 may include a plurality of cell strings which are coupled to the plurality of second bit lines BLb.

Each of the plurality of second memory blocks BLK2 may have the same size. The size of the second memory block BLK2 may be defined in the same manner as the size of the first memory block BLK1 is described above.

The width of the first memory block BLK1 in the first direction FD may be A1. The width of the second memory block BLK2 in the first direction FD may be A2, which is larger than A1. The length of the first memory block BLK1 in the second direction SD and the length of the second memory block BLK2 in the second direction SD may be substantially the same. The height of the first memory block BLK1 in the vertical direction VD and the height of the second memory block BLK2 in the vertical direction VD may be substantially the same. Thus, the number of the second memory blocks BLK2 included in the second wafer W2 may be less than the number of the first memory blocks BLK1 included in the first wafer W1.

The physical size of the first memory block BLK1 may be smaller than the physical size of the second memory block BLK2. The first memory block BLK1 may be a small block, and the second memory block BLK2 may be a large block.

Figure 4:
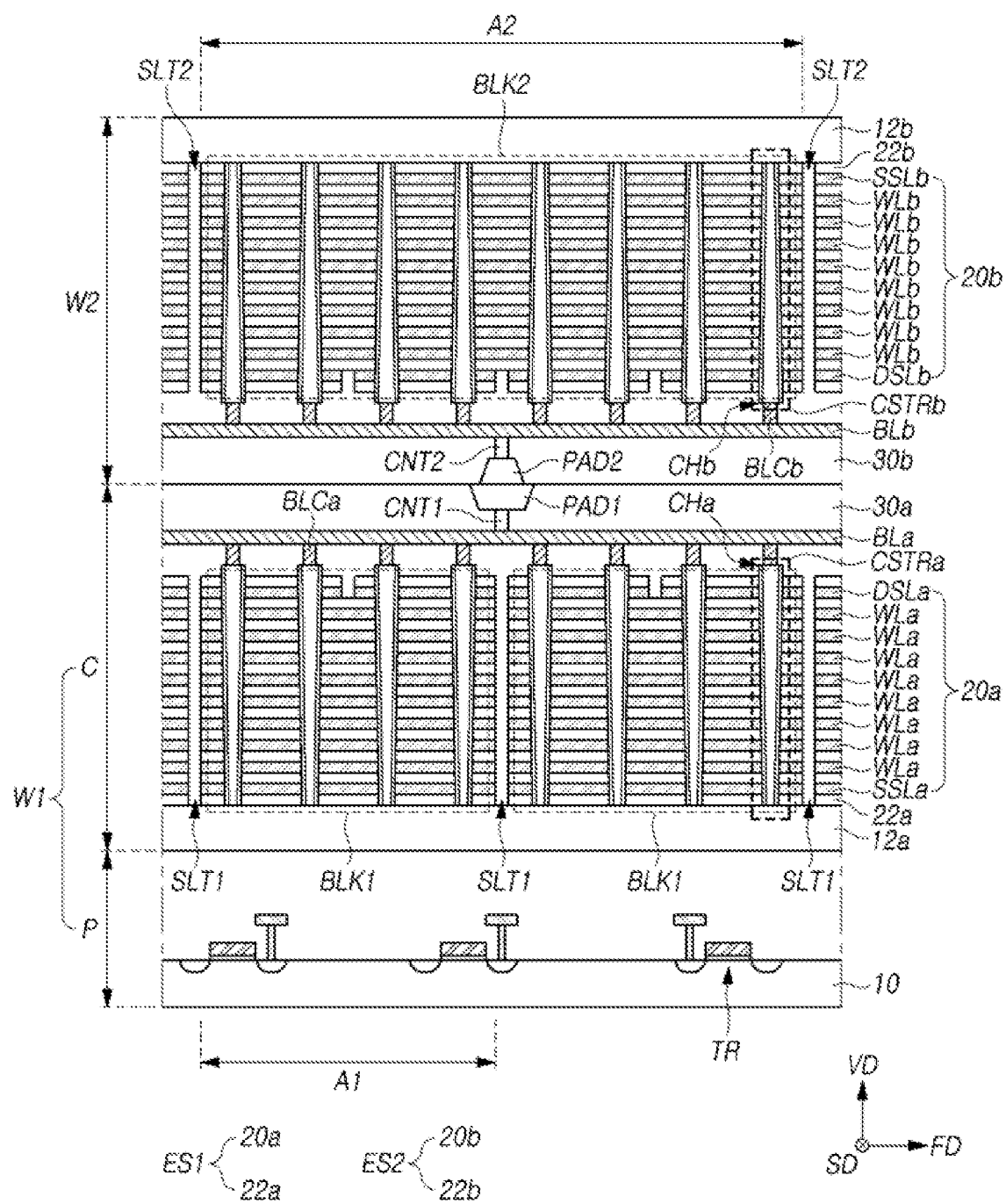
FIG. 4 is a cross-sectional view illustrating a representation of an example of a detailed structure of the first wafer and the second wafer of FIG. 3.

FIG. 4 is a cross-sectional view illustrating a representation of an example of a detailed structure of the first wafer and the second wafer of FIG. 3.

Referring to FIG. 4, the logic structure P may include a substrate 10 and a plurality of transistors TR, which are defined on the substrate 10. Although not illustrated, the logic structure P may further include elements such as inductors, capacitors, and resistors. The transistors TR, the inductors, the capacitors and the resistors may constitute a logic circuit (e.g., 120 of FIG. 1).

The memory structure C may include a substrate 12a, and a plurality of electrode layers 20a and a plurality of interlayer dielectric layers 22a, which are alternately stacked on the substrate 12a. The substrate 12a may be defined on the logic structure P. The electrode layers 20a may include a conductive material. For example, the electrode layers 20a may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 20a, at least one electrode layer 20a from the lowermost electrode layer 20a may configure a source select line SSLa. Among the electrode layers 20a, at least one electrode layer 20a from the uppermost electrode layer 20a may configure a drain select line DSLa. The electrode layers 20a between the source select line SSLa and the drain select line DSLa may configure word lines WLa. The interlayer dielectric layers 22a may include silicon oxide.

A plurality of vertical channels CHa, which pass through the plurality of electrode layers 20a and the plurality of interlayer dielectric layers 22a in the vertical direction VD, may be defined in the first wafer W1. While not illustrated in detail, each of the vertical channels CHa may include a channel layer and a gate dielectric layer. The channel layer may include polysilicon or monocrystalline silicon, and may include, in some regions thereof, a P-type impurity such as boron (B). The gate dielectric layer may have the shape of a straw or a cylindrical shell that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Source select transistors may be configured where the source select line SSLa surrounds the vertical channels CHa. Memory cells may be configured where the word lines WLa surround the vertical channels CHa. Drain select transistors may be configured where the drain select line DSLa surrounds the vertical channels CHa. The source select transistor, the plurality of memory cells and the drain select transistor disposed along one vertical channel CHa may configure one cell string CSTRa. The memory structure C may include a plurality of cell strings CSTRa.

Each of a plurality of first slits SLT1 is defined through the plurality of electrode layers 20a and the plurality of interlayer dielectric layers 22a. The plurality of first slits SLT1 divide the plurality of electrode layers 20a and the plurality of interlayer dielectric layers 22a alternately stacked into first memory block units. The first slit SLT1 may extend in the second direction SD and in the vertical direction VD. The plurality of electrode layers 20a, the plurality of interlayer dielectric layers 22a and the plurality of vertical channels CHa disposed between a pair of adjacent first slits SLT1 may configure one first memory block BLK1. The plurality of electrode layers 20a and the plurality of interlayer dielectric layers 22a included in one first memory block BLK1 may be defined as a first electrode structure ES1.

The plurality of first slits SLT1 may be provided or arranged in the first direction FD, and therefore, the plurality of first memory blocks BLK1 may be provided or arranged in the first direction FD. The number of vertical channels CHa included in one first memory block BLK1 may be determined by an interval between a pair of adjacent first slits SLT1.

The interval between adjacent first slits SLT1 may be A1. A1 may correspond to the width of the first memory block BLK1 in the first direction FD. The numbers of vertical channels CHa, and therefore the numbers of cell strings CSTRa, included in different first memory blocks BLK1 may be the same. The first memory blocks BLK1 may each include the same number of memory cells.

A first bit line BLa may be disposed over the plurality of first memory blocks BLK1. Bit line contacts BLCa may be defined under the first bit line BLa to couple the first bit line BLa and the vertical channels CHa. FIG. 4 is a cross-sectional view taken along the first bit line BLa. While FIG. 4 illustrates only one first bit line BLa, it should be understood that a plurality of first bit lines BLa are arranged in the second direction SD.

A dielectric layer 30a may be defined on the substrate 12a to fill the first slits SLT1 and to cover the plurality of first memory blocks BLK1 and the first bit line BLa. The top surface of the dielectric layer 30a may constitute one surface of the first wafer W1, which is bonded to the second wafer W2. A bonding pad PAD1 may be exposed on the top surface of the dielectric layer 30a. The bonding pad PAD1 may be coupled to the first bit line BLa through a contact CNT1.

The second wafer W2 may include a substrate 12b, and a plurality of electrode layers 20b and a plurality of interlayer dielectric layers 22b, which are alternately stacked on the bottom surface of the substrate 12b. The electrode layers 20b may be formed of the same material as the electrode layers 20a. Among the electrode layers 20b, at least one electrode layer 20b from the uppermost electrode layer 20b may configure a source select line SSLb. Among the electrode layers 20b, at least one electrode layer 20b from the lowermost electrode layer 20b may configure a drain select line DSLb. The electrode layers 20b between the source select line SSLb and the drain select line DSLb may configure word lines WLb. The interlayer dielectric layers 22b may be formed of the same material as the interlayer dielectric layers 22a.

A plurality of vertical channels CHb, which pass through the electrode layers 20b and the interlayer dielectric layers 22b in the vertical direction VD, may be defined in the second wafer W2. The vertical channels CHb may be configured in the same manner as the vertical channels CHa. Source select transistors may be configured where the source select line SSLb surrounds the vertical channels CHb. Memory cells may be configured where the word lines WLb surround the vertical channels CHb. Drain select transistors may be configured where the drain select line DSLb surrounds the vertical channels CHb. The source select transistor, the plurality of memory cells and the drain select transistor disposed along one vertical channel CHb may configure one cell string CSTRb. The second wafer W2 may include a plurality of cell strings CSTRb.

Each of a plurality of second slits SLT2 is defined through the plurality of electrode layers 20b and the plurality of interlayer dielectric layers 22b. The plurality of second slits SLT2 divide the plurality of electrode layers 20b and the plurality of interlayer dielectric layers 22b alternately stacked into second memory block units. The second slit SLT2 may extend in the second direction SD and in the vertical direction VD. The plurality of electrode layers 20b, the plurality of interlayer dielectric layers 22b and a plurality of vertical channels CHb disposed between a pair of adjacent second slits SLT2 may configure one second memory block BLK2. The plurality of electrode layers 20b and the plurality of interlayer dielectric layers 22b included in one second memory block BLK2 may be defined as a second electrode structure ES2.

The stack number of the word lines WLb of the second memory block BLK2 may be the same as the stack number of the word lines WLa of the first memory block BLK1. Consequently, the number of memory cells included in one cell string CSTRb may be the same as the number of memory cells included in one cell string CSTRa. The number of vertical channels CHa per unit area in the first memory block BLK1 and the number of vertical channels CHb per unit area in the second memory block BLK2 may be the same.

The plurality of second slits SLT2 may be provided or arranged in the first direction FD, and therefore, the plurality of second memory blocks BLK2 may be provided or arranged in the first direction FD. The number of vertical channels CHb included in one second memory block BLK2 may be determined by an interval between a pair of adjacent second slits SLT2.

The interval between adjacent second slits SLT2 may be A2. A2 may correspond to the width of the second memory block BLK2 in the first direction FD. The numbers of vertical channels CHb (and the numbers of cell strings CSTRb) included in different second memory blocks BLK2 may be the same. The second memory blocks BLK2 may each include the same number of memory cells.

A1 may be smaller than A2 so that the number of vertical channels CHa (the number of cell strings CSTRa) included in the first memory block BLK1 may be less than the number of vertical channels CHb (the number of cell strings CSTRb) included in the second memory block BLK2.

A second bit line BLb may be disposed below the plurality of second memory blocks BLK2. Bit line contacts BLCb may be defined on the second bit line BLb to couple the second bit line BLb and the vertical channels CHb. While FIG. 4 illustrates only one second bit line BLb, it should be understood that a plurality of second bit lines BLb are arranged in the second direction SD.

A dielectric layer 30b may be defined on the bottom surface of the substrate 12b to fill the second slits SLT2 and to cover the plurality of second memory blocks BLK2 and the second bit line BLb. The bottom surface of the dielectric layer 30b may constitute one surface of the second wafer W2, which is bonded to the first wafer W1. A bonding pad PAD2 may be exposed on the bottom surface of the dielectric layer 30b. The bonding pad PAD2 may be coupled to the second bit line BLb through a contact CNT2. The one surface of the second wafer W2 may be bonded to the one surface of the first wafer W1, and the bonding pad PAD2 may be coupled to the bonding pad PAD1.

FIG. 5 is a circuit diagram illustrating a representation of an example of a first memory block and a second memory block of FIG. 3.

Referring to FIG. 5, the first memory block BLK1 may include a plurality of cell strings CSTRa, which are coupled between a plurality of first bit lines BLa and a common source line CSLa. The first bit lines BLa may extend in the first direction FD, and may be arranged in the second direction SD. A plurality of cell strings CSTRa may be coupled in parallel to each of the first bit lines BLa. The plurality of cell strings CSTRa may be coupled in common to the common source line CSLa. The plurality of cell strings CSTRa may be coupled between the plurality of first bit lines BLa and one common source line CSLa.

Each of the plurality of cell strings CSTRa may include a drain select transistor DSTa that is coupled to the first bit line BLa, a source select transistor SSTa that is coupled to the common source line CSLa, and a plurality of memory cells MCa that are coupled between the drain select transistor DSTa and the source select transistor SSTa. The drain select transistor DSTa, the plurality of memory cells MCa and the source select transistor SSTa, which are included in one cell string CSTRa, may be coupled in series in the vertical direction VD.

A source select line SSLa, a plurality of word lines WLa and drain select lines DSLa may be arranged between the common source line CSLa and the first bit lines BLa in the vertical direction VD. Each of the drain select lines DSLa may be coupled to gates of corresponding drain select transistors DSTa. Each of the word lines WLa may be coupled to gates of corresponding memory cells MCa. The source select line SSLa may be coupled to gates of source select transistors SSTa. Memory cells MCa, which are coupled in common to one word line WLa, may configure one physical page.

The second memory block BLK2 may include a plurality of cell strings CSTRb, which are coupled between a plurality of second bit lines BLb and a common source line CSLb. The second bit lines BLb may extend in the first direction FD, and may be arranged in the second direction SD. A plurality of cell strings CSTRb may be coupled in parallel to each of the second bit lines BLb. The plurality of cell strings CSTRb may be coupled in common to the common source line CSLb. The plurality of cell strings CSTRb may be coupled between the plurality of second bit lines BLb and one common source line CSLb.

Each of the plurality of cell strings CSTRb may include a drain select transistor DSTb that is coupled to the second bit line BLb, a source select transistor SSTb that is coupled to the common source line CSLb, and a plurality of memory cells MCb that are coupled between the drain select transistor DSTb and the source select transistor SSTb. The drain select transistor DSTb, the plurality of memory cells MCb and the source select transistor SSTb, which are included in one cell string CSTRb, may be coupled in series in the vertical direction VD.

A source select line SSLb, a plurality of word lines WLb and drain select lines DSLb may be arranged between the common source line CSLb and the second bit lines BLb in the vertical direction VD. Each of the drain select lines DSLb may be coupled to gates of corresponding drain select transistors DSTb. Each of the word lines WLb may be coupled to gates of corresponding memory cells MCb. The source select line SSLb may be coupled to gates of source select transistors SSTb. Memory cells MCb, which are coupled in common to one word line WLb, may configure one physical page.

The number of the first bit lines BLa and the number of the second bit lines BLb may be the same as each other. An interval between adjacent first bit lines BLa and an interval between adjacent second bit lines BLb may be the same as each other. The number of memory cells MCa included in one cell string CSTRa and the number of memory cells MCb included in one cell string CSTRb may be the same as each other.

The number of memory cells MCa coupled to one word line WLa in one first memory block BLK1 may be less than the number of memory cells MCb coupled to one word line WLb in one second memory block BLK2. For example, the number of memory cells MCa coupled to one word line WLa in one first memory block BLK1 may be half the number of memory cells MCb coupled to one word line WLb in one second memory block BLK2.

The number of cell strings CSTRa included in the first memory block BLK1 may be less than the number of cell strings CSTRb included in the second memory block BLK2. For example, two cell strings CSTRa of the first memory block BLK1 may be coupled to each of the first bit lines BLa, and four cell strings CSTRb of the second memory block BLK2 may be coupled to each of the second bit lines BLb. In this case, the number of cell strings CSTRa included in the first memory block BLK1 may be half the number of cell strings CSTRb included in the second memory block BLK2.

The number of memory cells MCa included in the first memory block BLK1 may be less than the number of memory cells MCb included in the second memory block BLK2. The first memory block BLK1 may be a small block, and the second memory block BLK2 may be a large block.

Although the embodiment described above with reference to FIGS. 3 to 5 illustrates an example in which the number of cell strings CSTRa included in the first memory block BLK1 is half the number of cell strings CSTRb included in the second memory block BLK2, the disclosure is not limited thereto. The ratio of the number of cell strings CSTRa included in the first memory block BLK1 to the number of cell strings CSTRb included in the second memory block BLK2 may be variously changed.

Figure 6:
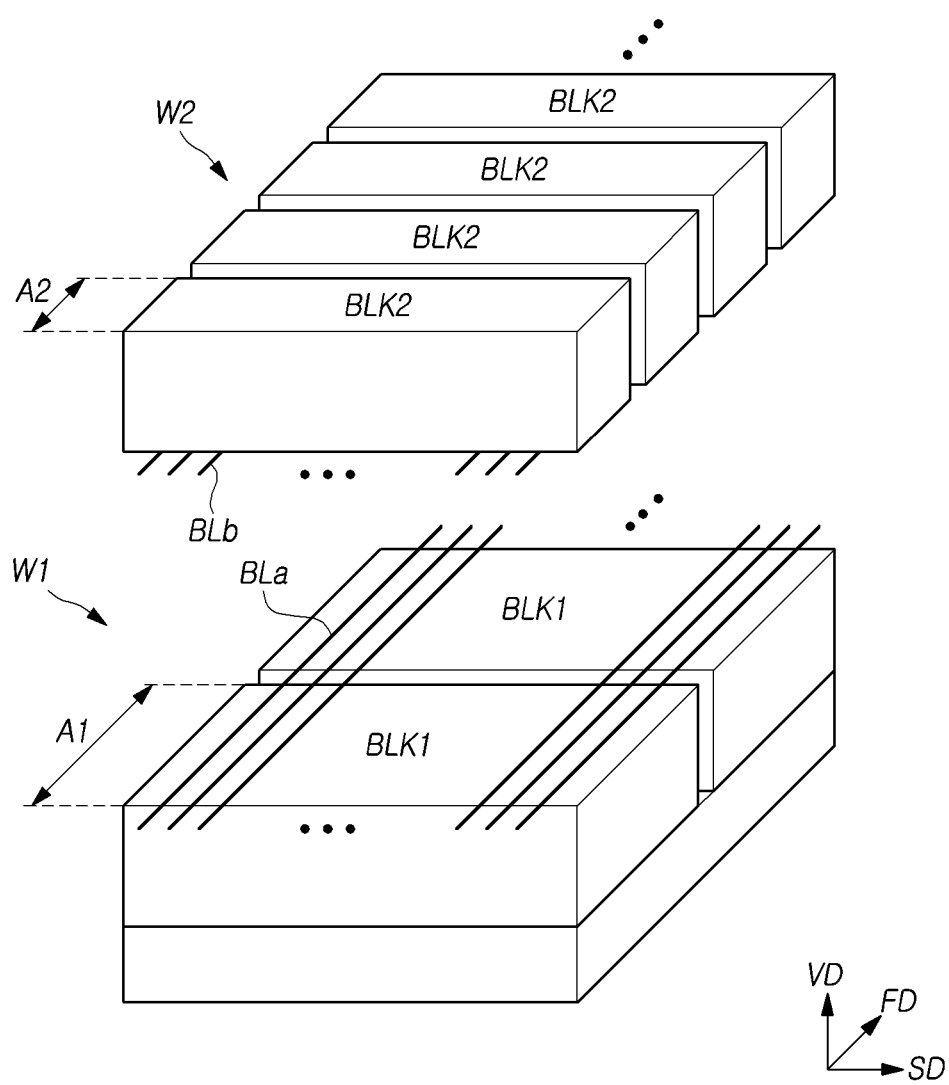
FIG. 6 is a diagram illustrating a representation of an example of another schematic disposition of the first wafer and the second wafer illustrated in FIG. 2.

FIG. 6 is a diagram illustrating a representation of an example of another schematic disposition of the first wafer W1 and the second wafer W2 illustrated in FIG. 2.

Referring to FIG. 6, the width of the first memory block BLK1 in the first direction FD may be A1. The width of the second memory block BLK2 in the first direction FD may be A2, which is smaller than A1. Therefore, the number of the first memory blocks BLK1 included in the first wafer W1 may be less than the number of the second memory blocks BLK2 included in the second wafer W2.

The length of the first memory block BLK1 in the second direction SD and the length of the second memory block BLK2 in the second direction SD may be substantially the same. The height of the first memory block BLK1 in the vertical direction VD and the height of the second memory block BLK2 in the vertical direction VD may be substantially the same.

The physical size of the first memory block BLK1 may be larger than the physical size of the second memory block BLK2. The first memory block BLK1 may be a large block, and the second memory block BLK2 may be a small block.

Figure 7:
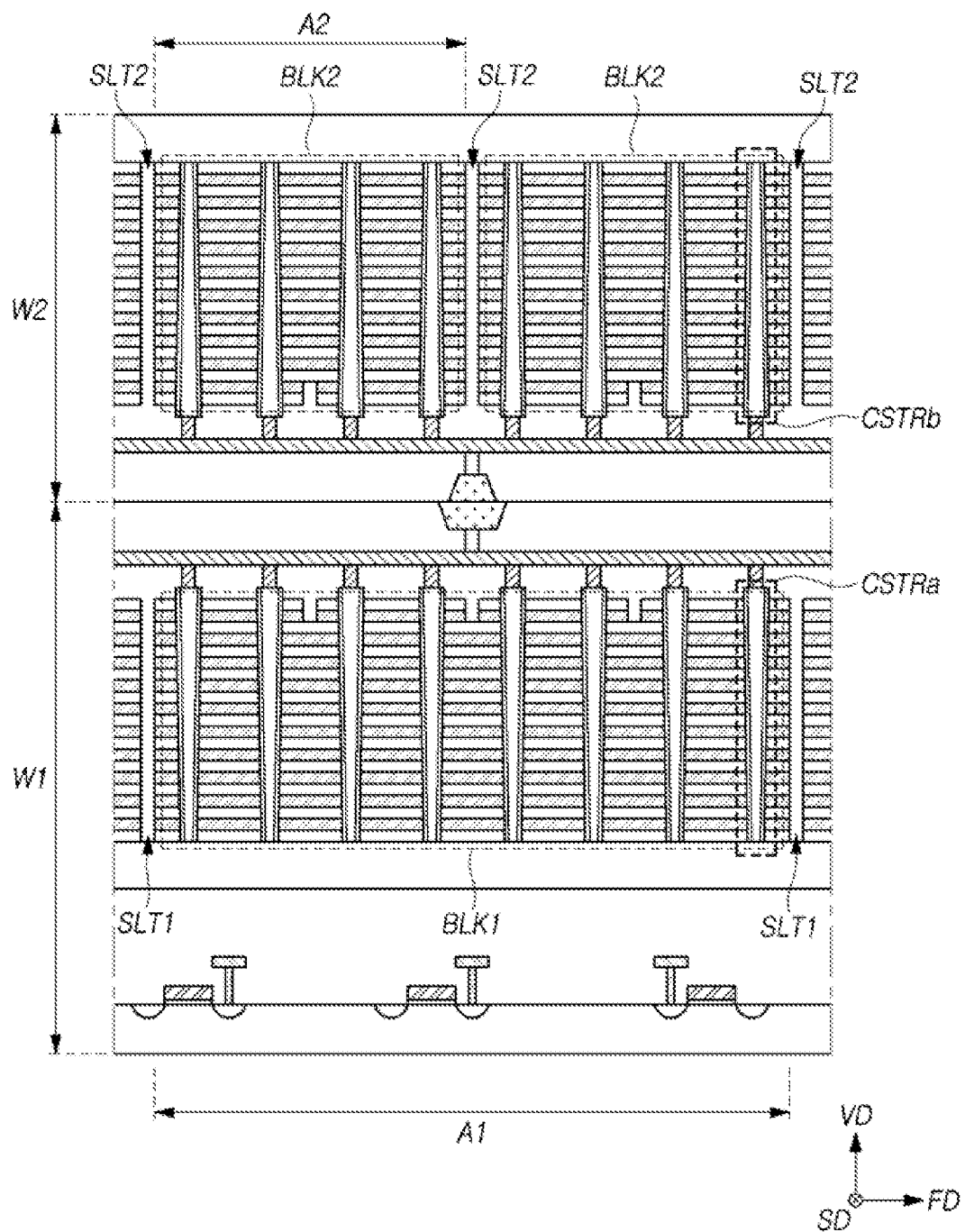
FIG. 7 is a cross-sectional view illustrating a representation of an example of a detailed structure of the first wafer and the second wafer illustrated in FIG. 6.

FIG. 7 is a cross-sectional view illustrating a representation of an example of a detailed structure of the first wafer and the second wafer illustrated in FIG. 6.

Referring to FIG. 7, an interval A1 between adjacent first slits SLT1 may be larger than an interval A2 between adjacent second slits SLT2. That is to say, the width of the first memory block BLK1 in the first direction FD may be larger than the width of the second memory block BLK2 in the first direction FD.

In FIG. 7, the number of cell strings CSTRa included in one first memory block BLK1 may be greater than the number of cell strings CSTRb included in one second memory block BLKb.

FIG. 8 is a circuit diagram illustrating a representation of an example of the first memory block and the second memory block illustrated in FIG. 6.

Referring to FIG. 8, the number of memory cells MCa coupled to one word line WLa in one first memory block BLK1 may be greater than the number of memory cells MCb coupled to one word line WLb in one second memory block BLK2. For example, the number of memory cells MCa coupled to one word line WLa in one first memory block BLK1 may be twice the number of memory cells MCb coupled to one word line WLb in one second memory block BLK2.

The number of cell strings CSTRa included in the first memory block BLK1 may be greater than the number of cell strings CSTRb included in the second memory block BLK2. For example, four cell strings CSTRa of the first memory block BLK1 may be coupled to each of the first bit lines BLa, and two cell strings CSTRb of the second memory block BLK2 may be coupled to each of the second bit lines BLb. In this case, the number of cell strings CSTRa included in the first memory block BLK1 may be twice the number of cell strings CSTRb included in the second memory block BLK2.

The number of memory cells MCa included in the first memory block BLK1 may be greater than the number of memory cells MCb included in the second memory block BLK2. The first memory block BLK1 may be a large block, and the second memory block BLK2 may be a small block.

Although the embodiment described above with reference to FIGS. 6 to 8 illustrates an example in which the number of cell strings CSTRa included in the first memory block BLK1 is twice the number of cell strings CSTRb included in the second memory block BLK2, the disclosure is not limited thereto. The ratio of the number of cell strings CSTRa included in the first memory block BLK1 to the number of cell strings CSTRb included in the second memory block BLK2 may be variously changed.

Figure 9:
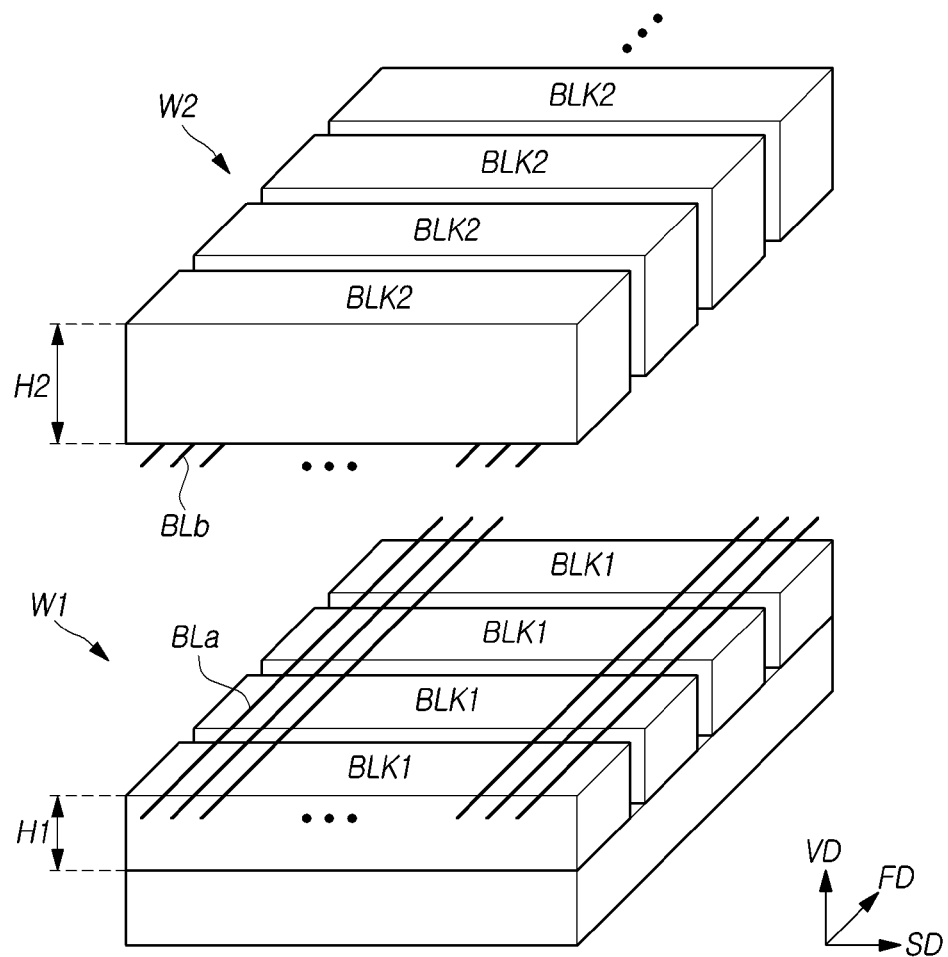
FIG. 9 is a diagram illustrating a representation of an example of another schematic disposition of the first wafer and the second wafer illustrated in FIG. 2.

FIG. 9 is a diagram illustrating a representation of an example of another schematic disposition of the first wafer and the second wafer illustrated in FIG. 2.

Referring to FIG. 9, the width of the first memory block BLK1 in the first direction FD and the width of the second memory block BLK2 in the first direction FD may be substantially the same. The length of the first memory block BLK1 in the second direction SD and the length of the second memory block BLK2 in the second direction SD may be substantially the same. The height of the first memory block BLK1 in the vertical direction VD may be H1. The height of the second memory block BLK2 in the vertical direction VD may be H2, which is larger than H1.

The physical size of the first memory block BLK1 may be smaller than the physical size of the second memory block BLK2. The first memory block BLK1 may be a small block, and the second memory block BLK2 may be a large block.

Figure 10:
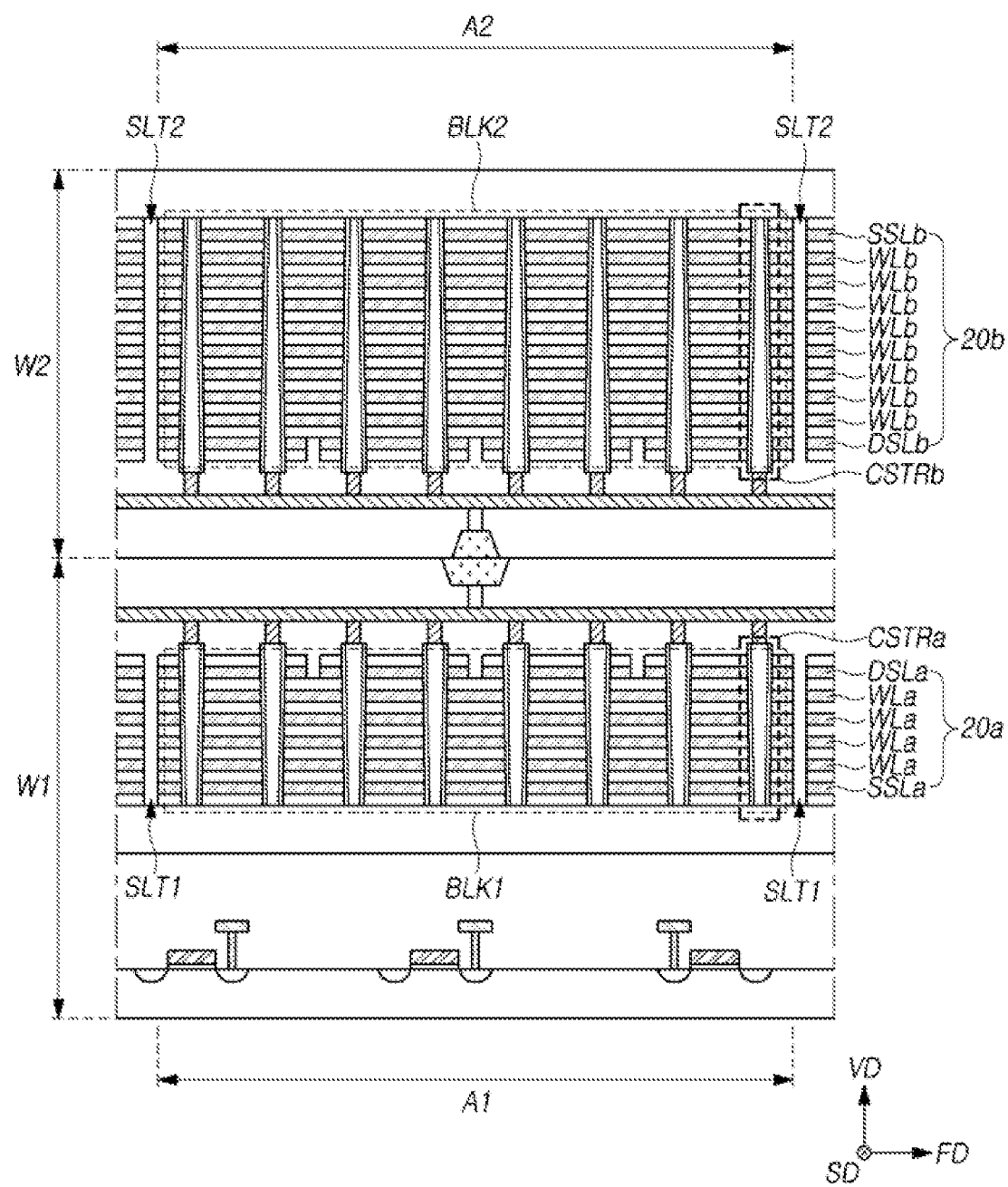
FIG. 10 is a cross-sectional view illustrating a representation of an example of a detailed structure of the first wafer and the second wafer of FIG. 9.

FIG. 10 is a cross-sectional view illustrating a representation of an example of a detailed structure of the first wafer and the second wafer of FIG. 9.

Referring to FIG. 10, an interval A1 between adjacent first slits SLT1 and an interval A2 between adjacent second slits SLT2 may be the same as each other. The width of the first memory block BLK1 in the first direction FD and the width of the second memory block BLK2 in the first direction FD may be the same as each other. As aforementioned with reference to FIG. 9, the length of the first memory block BLK1 in the second direction SD and the length of the second memory block BLK2 in the second direction SD may be substantially the same. In this case, the number of cell strings CSTRa included in the first memory block BLK1 and the number of cell strings CSTRb included in the second memory block BLKb may be the same as each other.

The stack number of word lines WLa of the first memory block BLK1 may be less than the stack number of word lines WLb of the second memory block BLK2. As a result, the number of memory cells included in one cell string CSTRa may be less than the number of memory cells included in one cell string CSTRb. For example, the stack number of word lines WLa of the first memory block BLK1 may be half the stack number of word lines WLb of the second memory block BLK2, and the number of memory cells included in one cell string CSTRa may be half the number of memory cells included in one cell string CSTRb.

FIG. 11 is a circuit diagram illustrating a representation of an example of the first memory block and the second memory block of FIG. 9.

Referring to FIG. 11, the number of cell strings CSTRa included in the first memory block BLK1 and the number of cell strings CSTRb included in the second memory block BLK2 may be the same as each other.

The number of memory cells MCa included in one cell string CSTRa may be less than the number of memory cells MCb included in one cell string CSTRb. For example, the number of memory cells MCa included in one cell string CSTRa may be half the number of memory cells MCb included in one cell string CSTRb. The number of memory cells MCa included in the first memory block BLK1 may be less than the number of memory cells MCb included in the second memory block BLK2. The first memory block BLK1 may be a small block, and the second memory block BLK2 may be a large block.

Figure 12:
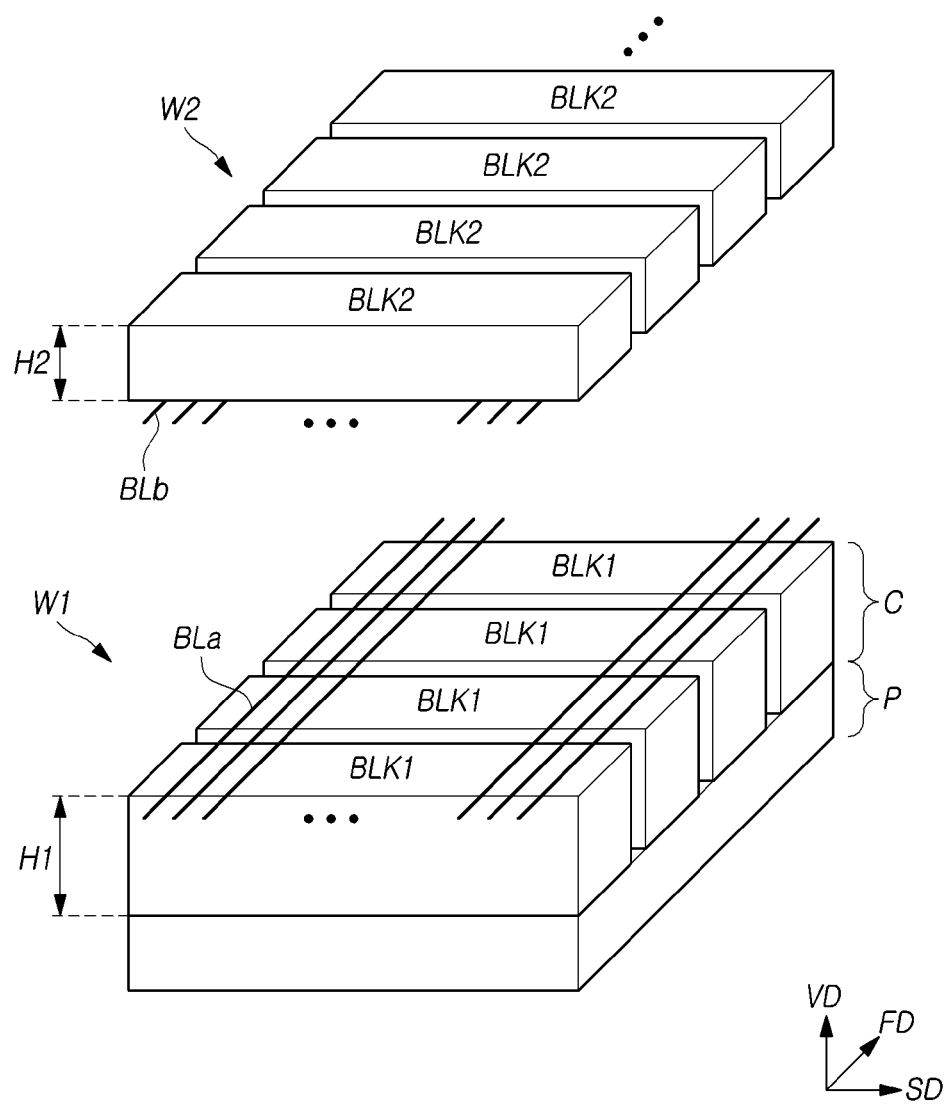
FIG. 12 is a diagram illustrating a representation of an example of another schematic disposition of the first wafer and the second wafer illustrated in FIG. 2.

FIG. 12 is a diagram illustrating a representation of an example of another schematic disposition of the first wafer and the second wafer illustrated in FIG. 2.

Referring to FIG. 12, the width of the first memory block BLK1 in the first direction FD and the width of the second memory block BLK2 in the first direction FD may be substantially the same. The length of the first memory block BLK1 in the second direction SD and the length of the second memory block BLK2 in the second direction SD may be substantially the same. The height of the first memory block BLK1 in the vertical direction VD may be H1. The height of the second memory block BLK2 in the vertical direction VD may be H2, which is smaller than H1.

The physical size of the first memory block BLK1 may be larger than the physical size of the second memory block BLK2. The first memory block BLK1 may be a large block, and the second memory block BLK2 may be a small block.

Figure 13:
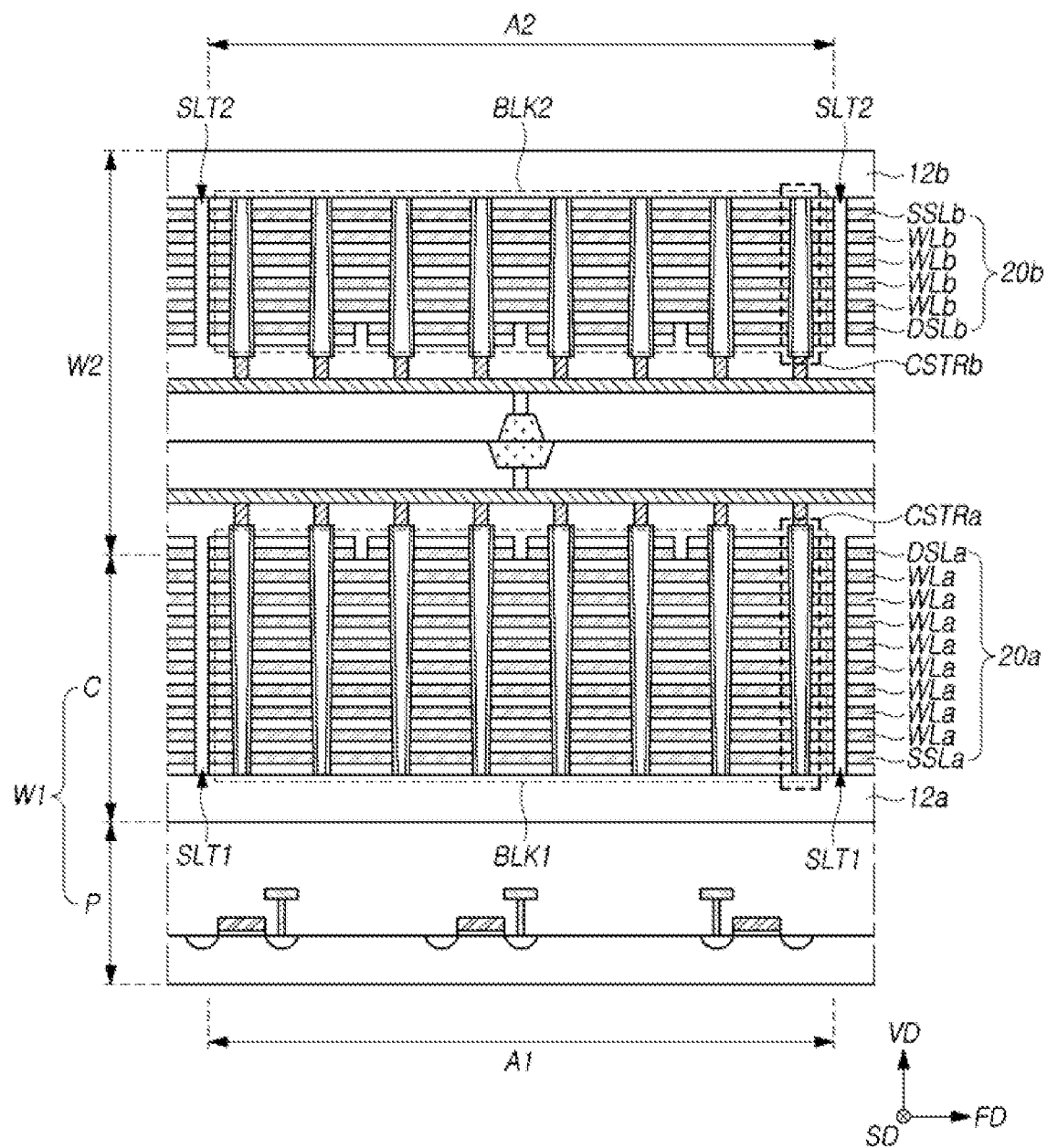
FIG. 13 is a cross-sectional view illustrating a representation of an example of a detailed structure of the first wafer and the second wafer illustrated in FIG. 12.

FIG. 13 is a cross-sectional view illustrating a representation of an example of a detailed structure of the first wafer and the second wafer illustrated in FIG. 12.

Referring to FIG. 13, an interval A1 between adjacent first slits SLT1 and an interval A2 between adjacent second slits SLT2 may be the same as each other. The width of the first memory block BLK1 in the first direction FD and the width of the second memory block BLK2 in the first direction FD may be the same as each other. As aforementioned with reference to FIG. 12, the length of the first memory block BLK1 in the second direction SD and the length of the second memory block BLK2 in the second direction SD may be substantially the same. In this case, the number of cell strings CSTRa included in the first memory block BLK1 and the number of cell strings CSTRb included in the second memory block BLKb may be the same as each other.

The stack number of word lines WLa of the first memory block BLK1 may be greater than the stack number of word lines WLb of the second memory block BLK2. As a result, the number of memory cells included in one cell string CSTRa may be greater than the number of memory cells included in one cell string CSTRb. For example, the stack number of word lines WLa of the first memory block BLK1 may be twice the stack number of word lines WLb of the second memory block BLK2, and the number of memory cells included in one cell string CSTRa may be twice the number of memory cells included in one cell string CSTRb.

Figure 14:
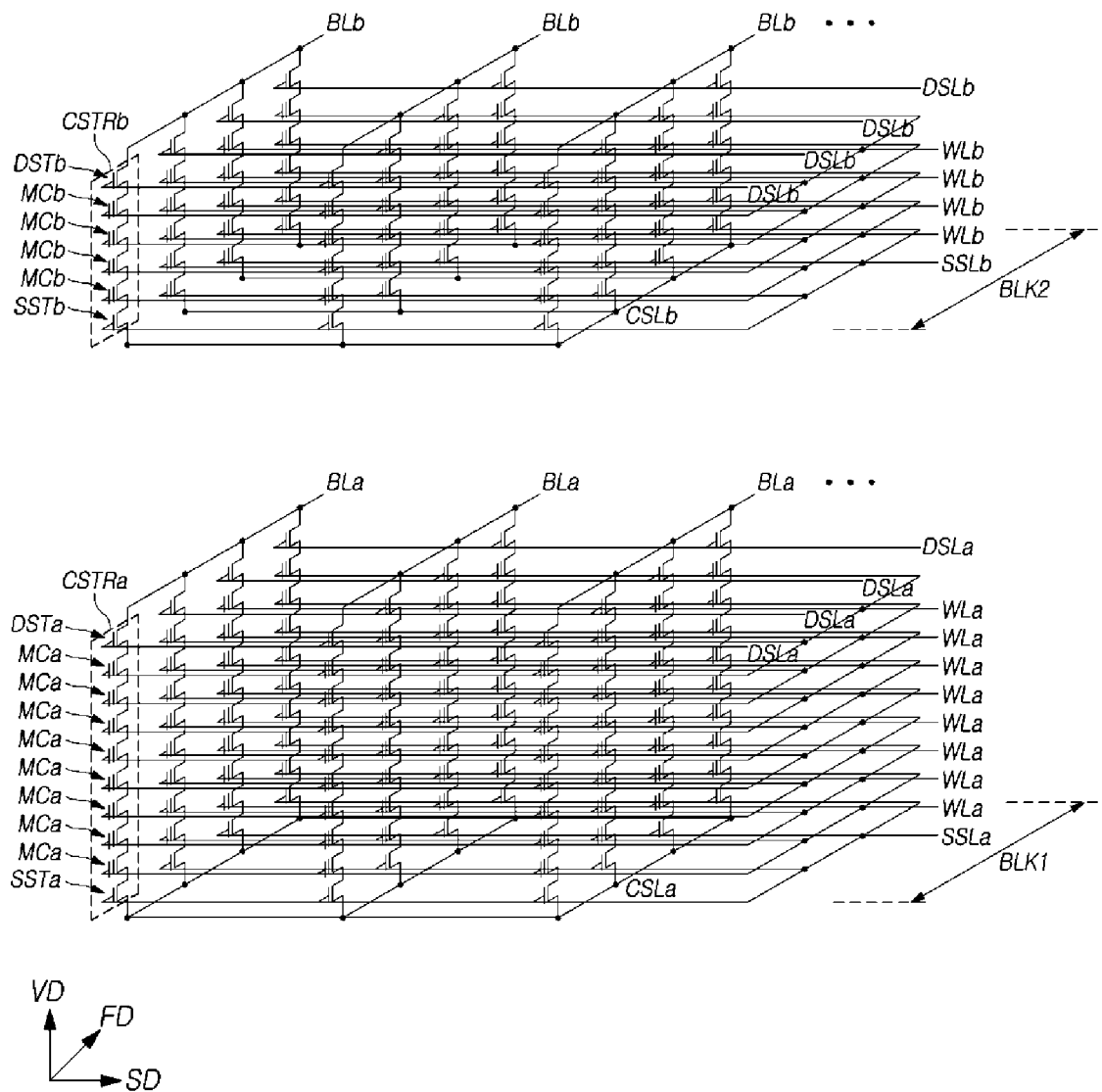
FIG. 14 is a circuit diagram illustrating a representation of an example of the first memory block and the second memory block of FIG. 12.

FIG. 14 is a circuit diagram illustrating a representation of an example of the first memory block and the second memory block of FIG. 12.

Referring to FIG. 14, the number of cell strings CSTRa included in the first memory block BLK1 and the number of cell strings CSTRb included in the second memory block BLK2 may be the same as each other.

The number of memory cells MCa included in each of the cell strings CSTRa may be greater than the number of memory cells MCb included in each of the cell strings CSTRb. For example, the number of memory cells MCa included in the cell string CSTRa may be twice the number of memory cells MCb included in the cell string CSTRb. The number of memory cells MCa included in the first memory block BLK1 may be greater than the number of memory cells MCb included in the second memory block BLK2. The first memory block BLK1 may be a large block, and the second memory block BLK2 may be a small block.

Figure 15:
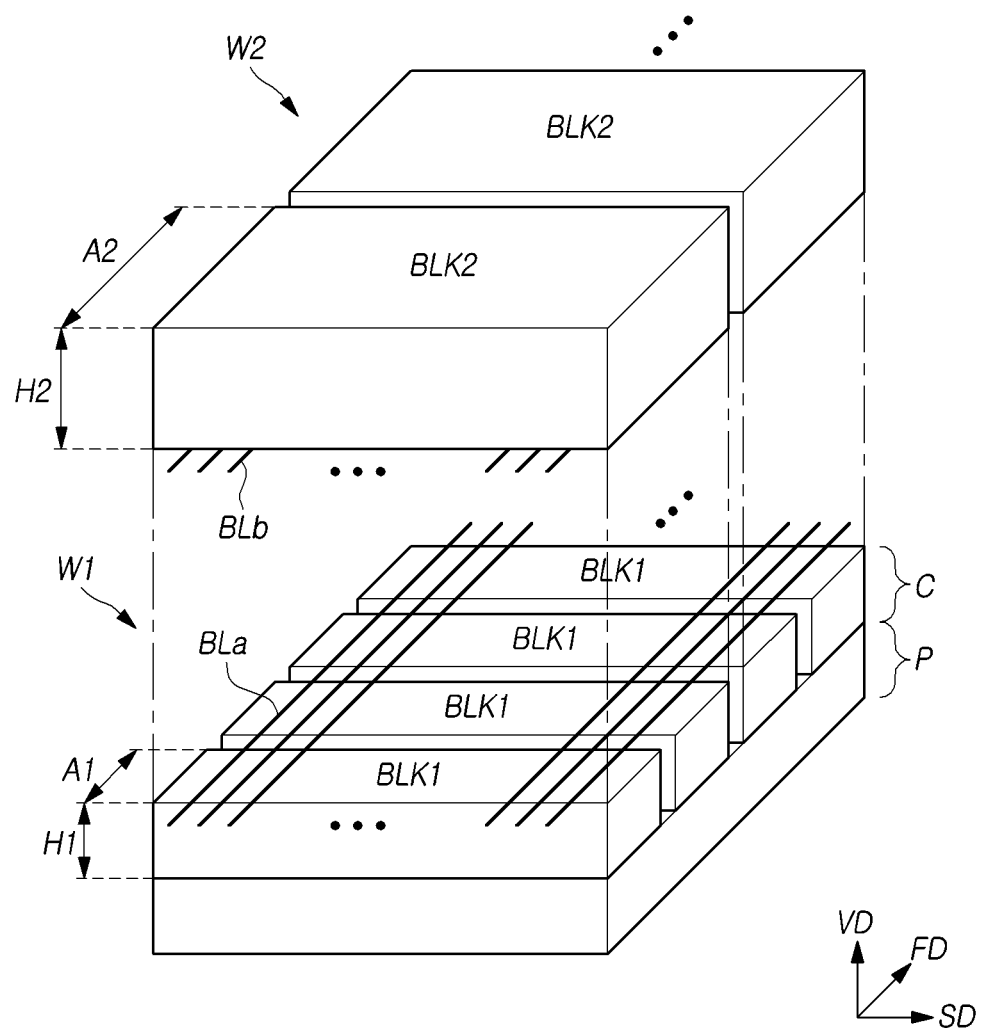
FIG. 15 is a diagram illustrating a representation of an example of another schematic disposition of the first wafer and the second wafer illustrated in FIG. 2.

FIG. 15 is a diagram illustrating a representation of an example of another schematic disposition of the first wafer and the second wafer illustrated in FIG. 2.

Referring to FIG. 15, the width of the first memory block BLK1 in the first direction FD may be A1. The width of the second memory block BLK2 in the first direction FD may be A2, which is larger than A1. As a result, the number of the second memory blocks BLK2 included in the second wafer W2 may be less than the number of the first memory blocks BLK1 included in the first wafer W1.

The length of the first memory block BLK1 in the second direction SD and the length of the second memory block BLK2 in the second direction SD may be substantially the same. The height of the first memory block BLK1 in the vertical direction VD may be H1. The height of the second memory block BLK2 in the vertical direction VD may be H2, which is larger than H1.

The physical size of the first memory block BLK1 may be smaller than the physical size of the second memory block BLK2. The first memory block BLK1 may be a small block, and the second memory block BLK2 may be a large block.

Figure 16:
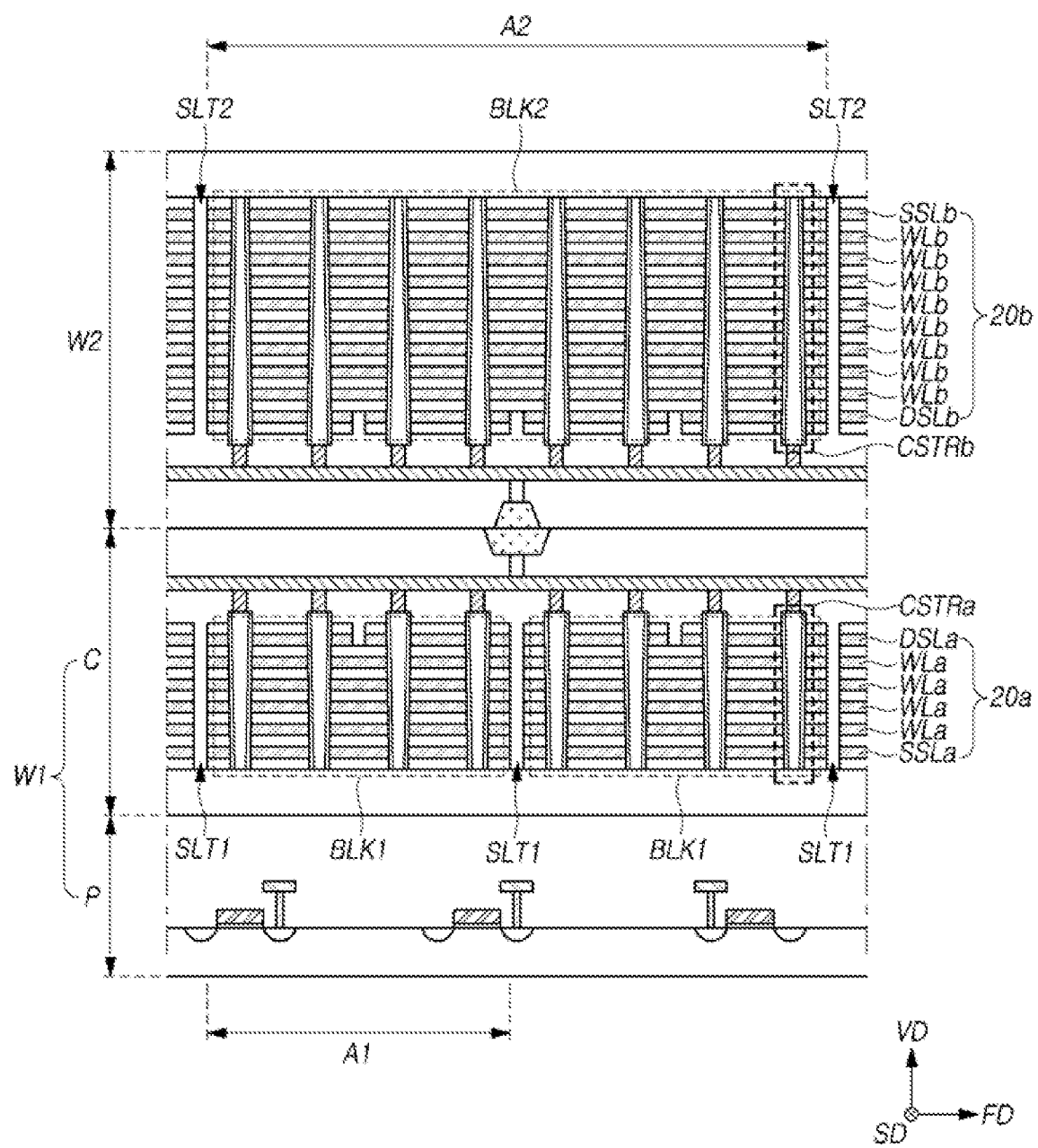
FIG. 16 is a cross-sectional view illustrating a representation of an example of a detailed structure of the first wafer and the second wafer of FIG. 15.

FIG. 16 is a cross-sectional view illustrating a representation of an example of a detailed structure of the first wafer and the second wafer of FIG. 15.

Referring to FIG. 16, an interval A1 between adjacent first slits SLT1 may be smaller than an interval A2 between adjacent second slits SLT2. That is to say, the width of the first memory block BLK1 in the first direction FD may be smaller than the width of the second memory block BLK2 in the first direction FD. As aforementioned with reference to FIG. 15, the length of the first memory block BLK1 in the second direction SD and the length of the second memory block BLK2 in the second direction SD may be substantially the same. The number of cell strings CSTRa included in the first memory block BLK1 may be less than the number of cell strings CSTRb included in the second memory block BLK2.

The stack number of word lines WLa of the first memory block BLK1 may be less than the stack number of word lines WLb of the second memory block BLK2. As a result, the number of memory cells included in one cell string CSTRa may be less than the number of memory cells included in one cell string CSTRb. For example, the stack number of word lines WLa of the first memory block BLK1 may be half the stack number of word lines WLb of the second memory block BLK2, and the number of memory cells included in one cell string CSTRa may be half the number of memory cells included in one cell string CSTRb.

FIG. 17 is a circuit diagram illustrating a representation of an example of the first memory block and the second memory block of FIG. 15.

Referring to FIG. 17, the number of memory cells MCa coupled to one word line WLa in the first memory block BLK1 may be less than the number of memory cells MCb coupled to one word line WLb in the second memory block BLK2. For example, the number of memory cells MCa coupled to one word line WLa in the first memory block BLK1 may be half the number of memory cells MCb coupled to one word line WLb in the second memory block BLK2.

The number of cell strings CSTRa included in the first memory block BLK1 may be less than the number of cell strings CSTRb included in the second memory block BLK2. For example, two cell strings CSTRa of the first memory block BLK1 may be coupled to each of the first bit lines BLa, and four cell strings CSTRb of the second memory block BLK2 may be coupled to each of the second bit lines BLb. In this case, the number of cell strings CSTRa included in the first memory block BLK1 may be half the number of cell strings CSTRb included in the second memory block BLK2.

The number of memory cells MCa included in each of the cell strings CSTRa may be less than the number of memory cells MCb included in each of the cell strings CSTRb. For example, the number of memory cells MCa included in one cell string CSTRa may be half the number of memory cells MCb included in one cell string CSTRb.

In an example, the number of memory cells MCa included in the first memory block BLK1 may be one-fourth (¼) of the number of memory cells MCb included in the second memory block BLK2. The first memory block BLK1 may be a small block, and the second memory block BLK2 may be a large block.

Although in embodiments described with reference to FIGS. 15 to 17, the number of cell strings CSTRa included in the first memory block BLK1 is less than the number of cell strings CSTRb included in the second memory block BLK2 and the number of memory cells MCa included in one cell string CSTRa in the first memory block BLK1 is less than the number of memory cells MCb included in one cell string CSTRb in the second memory block BLK2, embodiments that are opposite or the reverse are also possible. In other words, the number of cell strings CSTRa included in the first memory block BLK1 may be greater than the number of cell strings CSTRb included in the second memory block BLK2, and the number of memory cells MCa included in one cell string CSTRa in the first memory block BLK1 may be greater than the number of memory cells MCb included in one cell string CSTRb in the second memory block BLK2.

Figure 18:
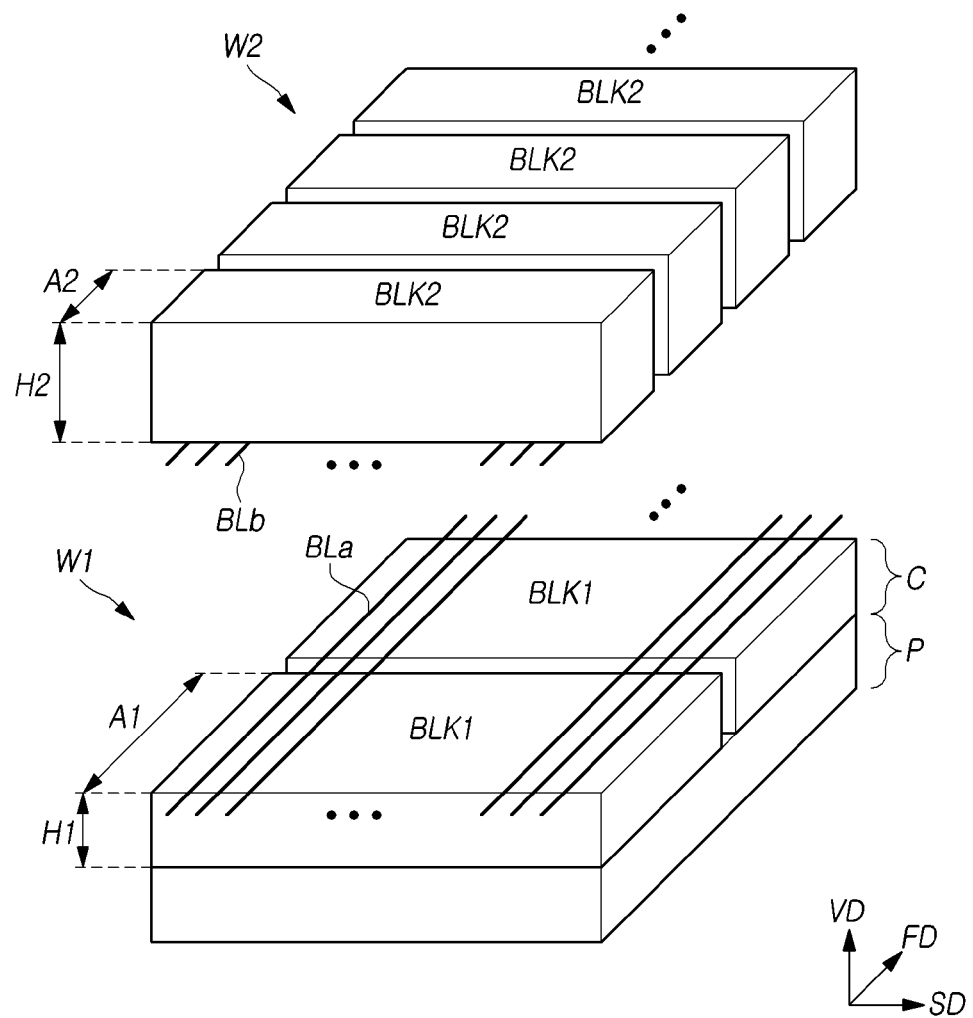
FIG. 18 is a diagram illustrating a representation of an example of another schematic disposition of the first wafer and the second wafer illustrated in FIG. 2.

FIG. 18 is a diagram illustrating a representation of an example of another schematic disposition of the first wafer and the second wafer illustrated in FIG. 2.

Referring to FIG. 18, the width of the first memory block BLK1 in the first direction FD may be A1. The width of the second memory block BLK2 in the first direction FD may be A2, which is smaller than A1. As a result, the number of the first memory blocks BLK1 included in the first wafer W1 may be less than the number of the second memory blocks BLK2 included in the second wafer W2.

The length of the first memory block BLK1 in the second direction SD and the length of the second memory block BLK2 in the second direction SD may be substantially the same. A height H1 of the first memory block BLK1 in the vertical direction VD may be smaller than a height H2 of the second memory block BLK2 in the vertical direction VD.

Figure 19:
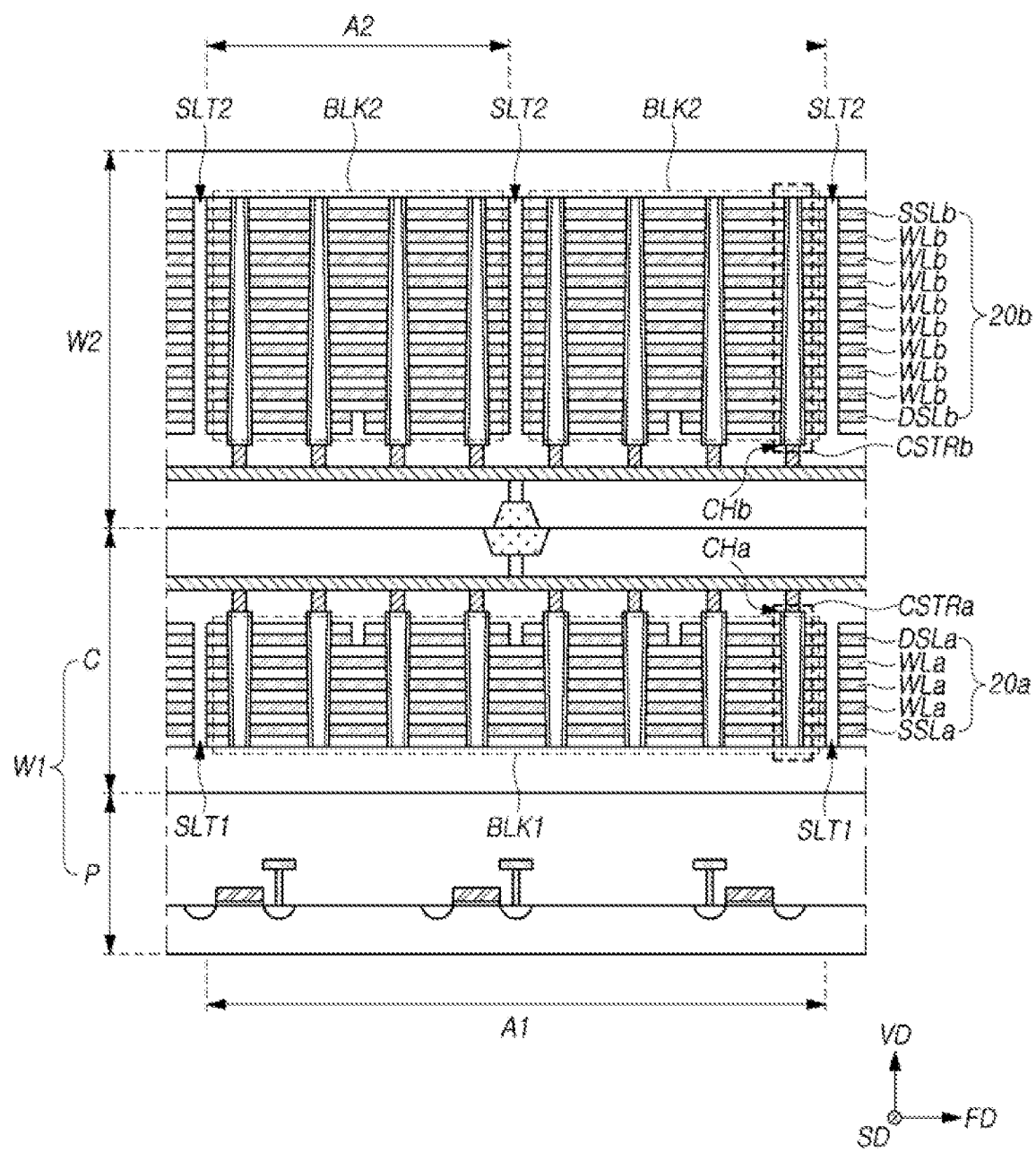
FIG. 19 is a cross-sectional view illustrating a representation of an example of a detailed structure of the first wafer and the second wafer of FIG. 18.

FIG. 19 is a cross-sectional view illustrating a representation of an example of a detailed structure of the first wafer and the second wafer of FIG. 18.

Referring to FIG. 19, an interval A1 between adjacent first slits SLT1 may be larger than an interval A2 between adjacent second slits SLT2. That is to say, the width of the first memory block BLK1 in the first direction FD may be larger than the width of the second memory block BLK2 in the first direction FD. As aforementioned with reference to FIG. 18, the length of the first memory block BLK1 in the second direction SD and the length of the second memory block BLK2 in the second direction SD may be substantially the same. The number of cell strings CSTRa included in the first memory block BLK1 may be greater than the number of cell strings CSTRb included in the second memory block BLK2.

The stack number of word lines WLa of the first memory block BLK1 may be less than the stack number of word lines WLb of the second memory block BLK2. As a result, the number of memory cells included in one cell string CSTRa may be less than the number of memory cells included in one cell string CSTRb.

Figure 20:
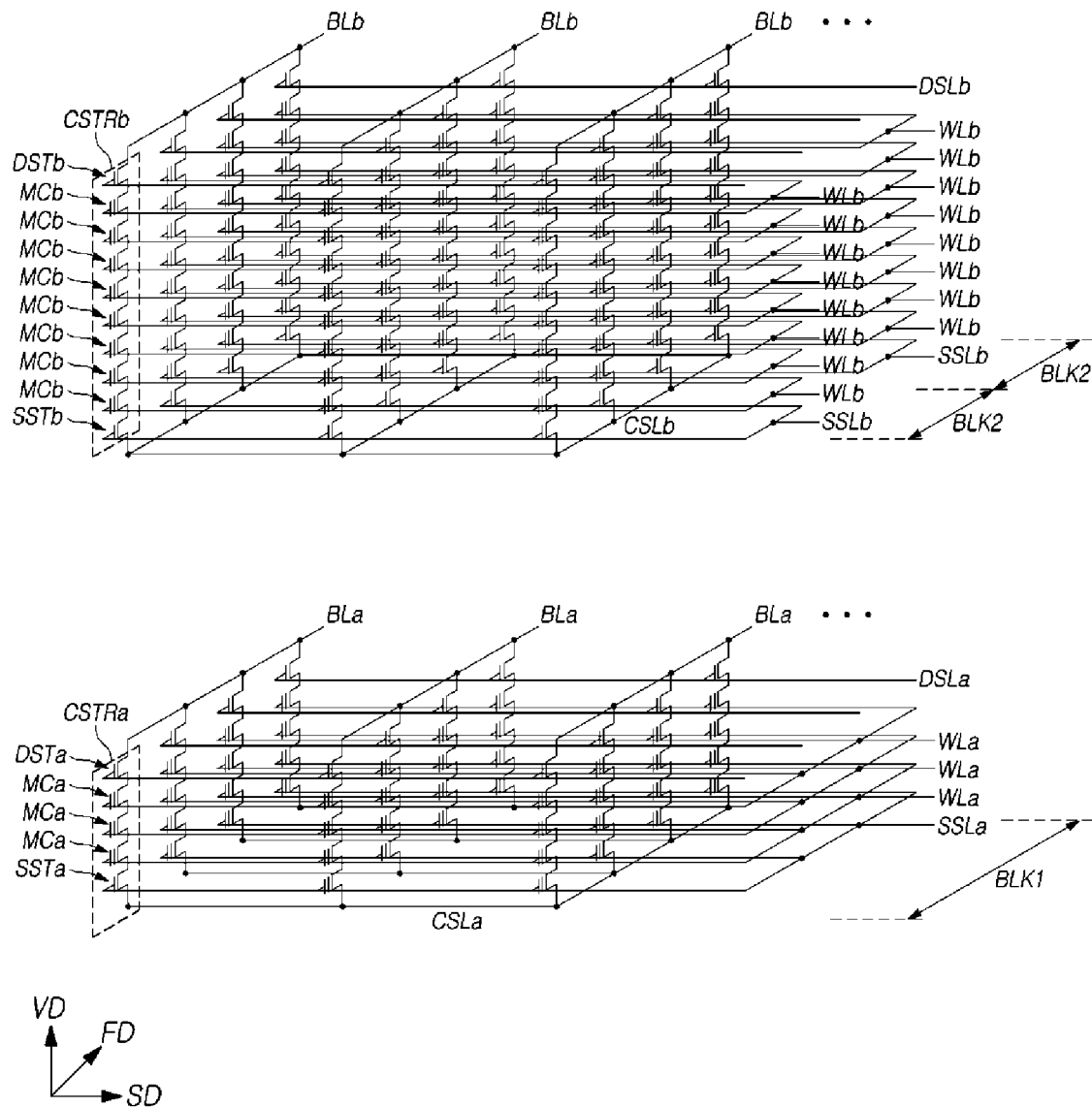
FIG. 20 is a circuit diagram illustrating a representation of an example of the first memory block and the second memory block of FIG. 18.

FIG. 20 is a circuit diagram illustrating a representation of an example of the first memory block and the second memory block of FIG. 18.

Referring to FIG. 20, the number of memory cells MCa coupled to one word line WLa in the first memory block BLK1 may be greater than the number of memory cells MCb coupled to one word line WLb in the second memory block BLK2. For example, the number of memory cells MCa coupled to one word line WLa in the first memory block BLK1 may be twice the number of memory cells MCb coupled to one word line WLb in the second memory block BLK2.

The number of cell strings CSTRa included in the first memory block BLK1 may be greater than the number of cell strings CSTRb included in the second memory block BLK2. For example, four cell strings CSTRa of the first memory block BLK1 may be coupled to each of the first bit lines BLa, and two cell strings CSTRb of the second memory block BLK2 may be coupled to each of the second bit lines BLb. In this case, the number of cell strings CSTRa included in the first memory block BLK1 may be twice the number of cell strings CSTRb included in the second memory block BLK2.

The number of memory cells MCa included in one cell string CSTRa may be less than the number of memory cells MCb included in one cell string CSTRb. For example, the number of memory cells MCa included in one cell string CSTRa may be three, and the number of memory cells MCb included in one cell string CSTRb may be eight.

In this case, the number of memory cells MCa included in the first memory block BLK1 may be defined as the product of the number (four) of cell strings CSTRa coupled to one first bit line BLa in the first memory block BLK1, the number (three) of memory cells MCa included in one cell string CSTRa, and the number of first bit lines BLa. Namely, the number of memory cells MCa included in the first memory block BLK1 may be twelve (12) times the number of first bit lines BLa. Further, the number of memory cells MCb included in the second memory block BLK2 may be defined as the product of the number (two) of cell strings CSTRb coupled to one second bit line BLb in the second memory block BLK2, the number (eight) of memory cells MCb included in one cell string CSTRb, and the number of second bit lines BLb. Namely, the number of memory cells MCb included in the second memory block BLK2 may be sixteen (16) times the number of second bit lines BLb.

As the number of first bit lines BLa and the number of second bit lines BLb are the same, the ratio of the number of memory cells MCa included in the first memory block BLK1 to the number of memory cells MCb included in the second memory block BLK2 may be 12:16. The first memory block BLK1 may be a small block, and the second memory block BLK2 may be a large block.

Hereunder, a coupling structure between a memory cell array and a logic circuit of a memory device in accordance with an embodiment of the disclosure will be described with reference to FIGS. 21 to 25.

Figure 21:
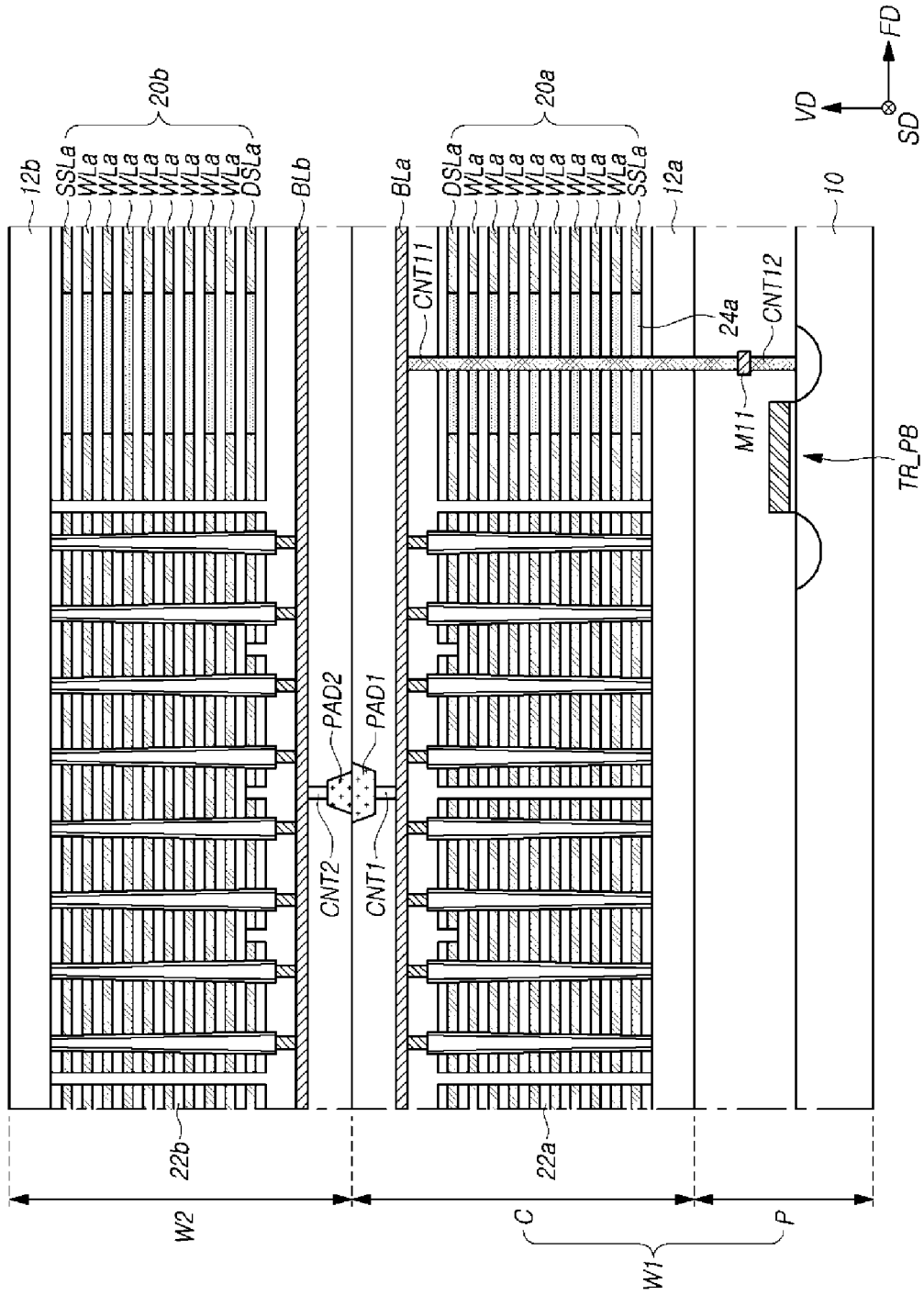
FIG. 21 is a cross-sectional view illustrating a representation of an example of a coupling structure between bit lines and a page buffer circuit of the memory device in accordance with an embodiment of the disclosure.

FIG. 21 is a cross-sectional view illustrating a representation of an example of a coupling structure between bit lines and a page buffer circuit of the memory device in accordance with an embodiment of the disclosure.

Referring to FIG. 21, the logic structure P may include a transistor TR_PB, which is defined on the substrate 10. The transistor TR_PB illustrated in FIG. 21 may configure a page buffer circuit.

As described above with reference to FIG. 4, the first bit line BLa of the first wafer W1 and the second bit line BLb of the second wafer W2 corresponding thereto may be coupled to each other through the contacts CNT1 and CNT2 and the bonding pads PAD1 and PAD2. The first bit line BLa of the first wafer W1 may be coupled to the transistor TR_PB through contacts CNT11 and CNT12 and a wiring line M11.

In order to insulate the electrode layers 20a and the contact CNT11 from each other, dielectric layers 24a, instead of the electrode layers 20a, may be stacked alternately with the interlayer dielectric layers 22a in a partial region. That is to say, in the partial region, a plurality of dielectric layers 24a may be stacked on the substrate 12a alternately with the plurality of interlayer dielectric layers 22a. The dielectric layers 24a may be formed of a dielectric material that has an etching selectivity with respect to the interlayer dielectric layers 22a. For example, the interlayer dielectric layers 22a may be silicon oxide, and the dielectric layers 24a may be silicon nitride.

The contact CNT11 may pass through the plurality of interlayer dielectric layers 22a and the plurality of dielectric layers 24a, alternately stacked, in the vertical direction VD.

Figure 22:
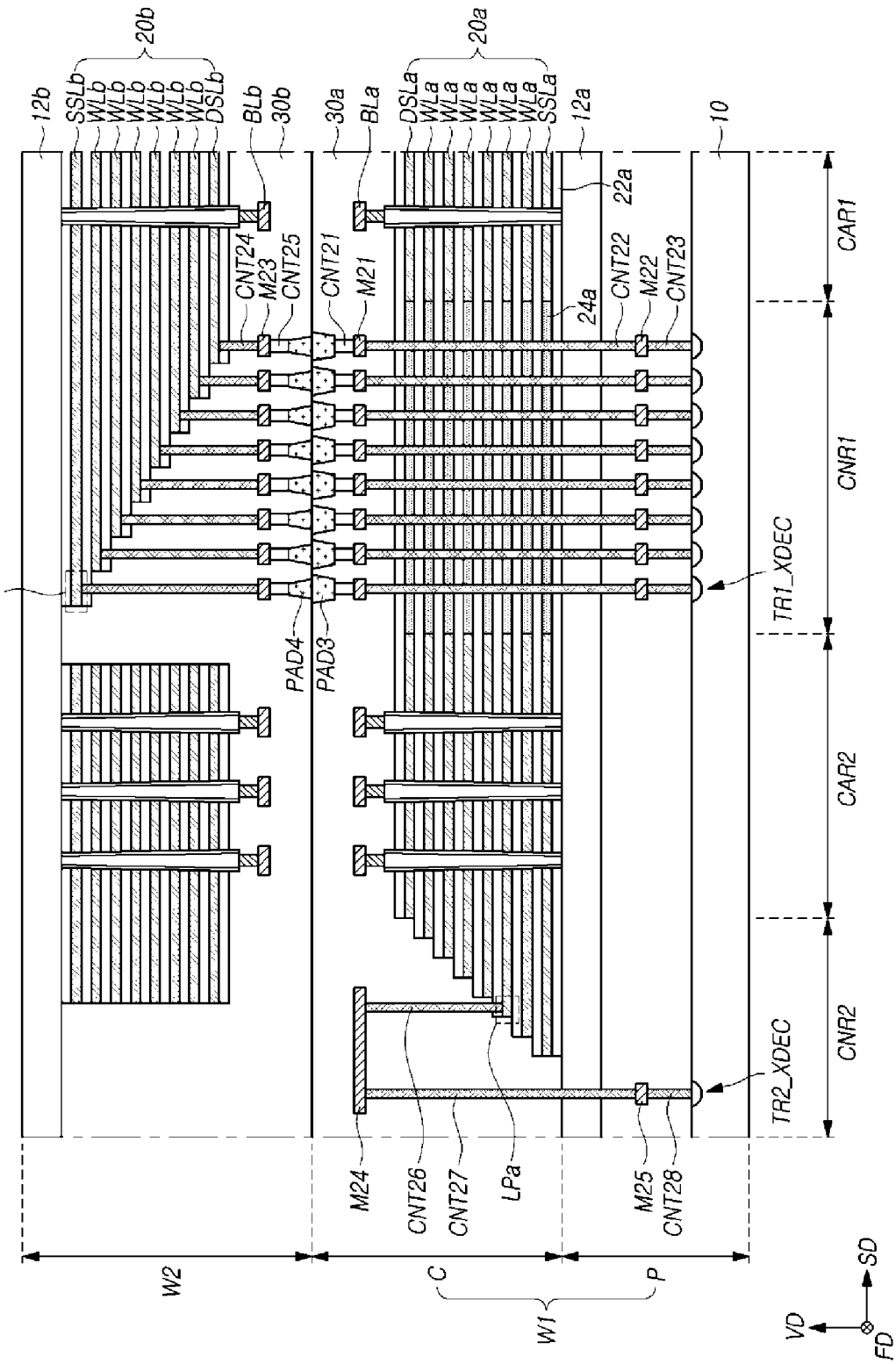
FIG. 22 is a cross-sectional view illustrating a representation of an example of a coupling structure between row lines and a row decoder of the memory device in accordance with an embodiment of the disclosure.

FIG. 22 is a cross-sectional view illustrating a representation of an example of a coupling structure between row lines and a row decoder of the memory device in accordance with an embodiment of the disclosure.

Referring to FIG. 22, a memory device may include a plurality of cell regions CAR1 and CAR2 and a plurality of coupling regions CNR1 and CNR2. The plurality of cell regions CAR1 and CAR2 and the plurality of coupling regions CNR1 and CNR2 may be alternately disposed in the second direction SD. Hereinafter, for the sake of convenience in explanation, the coupling region CNR1, which is disposed between neighboring cell regions CAR1 and CAR2, is defined as a first coupling region, and the coupling region CNR2, which is disposed at an edge of the memory device, is defined as a second coupling region. The cell region CAR2 may be disposed between the first coupling region CNR1 and the second coupling region CNR2.

A plurality of first transistors TR1_XDEC and a second transistor TR2_XDEC may be defined on the substrate 10 of the logic structure P. FIG. 22 is a cross-sectional view taken in a direction in which drain regions of the plurality of first transistors TR1_XDEC and the second transistor TR2_XDEC are arranged, and it should be understood that FIG. 22 does not illustrate elements, other than the drain regions, that configure the first transistors TR1_XDEC and the second transistor TR2_XDEC, such as for example, gates and source regions. While FIG. 22 illustrates only one second transistor TR2_XDEC for the sake of simplicity in illustration, it should be understood that a plurality of second transistors TR2_XDEC corresponding to the plurality of electrode layers 20a are defined on the substrate 10.

The plurality of first transistors TR1_XDEC may be pass transistors that serve to transfer an operating voltage to the electrode layers 20b of the second wafer W2, and the plurality of second transistors TR2_XDEC may be pass transistors that serve to transfer an operating voltage to the electrode layers 20a of the first wafer W1. The first and second transistors TR1_XDEC and TR2_XDEC illustrated in FIG. 22 may configure a row decoder.

In the present embodiment, the plurality of first transistors TR1_XDEC may be disposed in the first coupling region CNR1. A plurality of bonding pads PAD3 corresponding to the first transistors TR1_XDEC, respectively, may be defined on the one surface of the first wafer W1 bonded to the second wafer W2, in the first coupling region CNR1. Each of the bonding pads PAD3 may be coupled to a corresponding first transistor TR1_XDEC through contacts CNT21, CNT22 and CNT23 and wiring lines M21 and M22.

In order to insulate the electrode layers 20a and the contacts CNT22 from each other, the dielectric layers 24a, instead of the electrode layers 20a, may be stacked alternately with the interlayer dielectric layers 22a in the first coupling region CNR1. In other words, in the first coupling region CNR1, as the plurality of dielectric layers 24a are stacked alternately with the plurality of interlayer dielectric layers 22a on the substrate 12a, a dielectric stack may be defined. The dielectric layers 24a may be formed of a dielectric material that has an etching selectivity with respect to the interlayer dielectric layers 22a. For example, the interlayer dielectric layers 22a may be silicon oxide, and the dielectric layers 24a may be silicon nitride. In the first coupling region CNR1, the contacts CNT22 may pass through the plurality of interlayer dielectric layers 22a and the plurality of dielectric layers 24a, alternately stacked, in the vertical direction VD.

In the first coupling region CNR1, each of the electrode layers 20b of the second wafer W2 may have a pad part LPb. As the pad parts LPb of the electrode layers 20b are staggered with one another, a step structure may be configured. A contact CNT24 may be coupled to the pad part LPb of the electrode layer 20b. In the first coupling region CNR1, the pad parts LPb of the electrode layers 20b may overlap with the insulation stack (i.e., the plurality of interlayer dielectric layers 22a and the plurality of dielectric layers 24a alternately stacked) of the first wafer W1 in the vertical direction VD.

In the first coupling region CNR1, bonding pads PAD4 corresponding to the pad parts LPb of the electrode layers 20b, respectively, may be defined on the one surface of the second wafer W2 bonded to the first wafer W1. The contact CNT24 coupled to the pad part LPb of the electrode layer 20b may be coupled to the bonding pad PAD4 through a wiring line M23 and a contact CNT25. The bonding pads PAD4 of the second wafer W2 may be bonded to the bonding pads PAD3 of the first wafer W1, respectively, to configure electrical paths that couple the electrode layers 20b and the first transistors TR1_XDEC.

In the second coupling region CNR2, each of the electrode layers 20a of the first wafer W1 may have a pad part LPa. As the pad parts LPa of the electrode layers 20a are staggered with one another, a step structure may be configured.

A contact CNT26 may be coupled to the pad part LPa of the electrode layer 20a. The contact CNT26 may be coupled to the second transistor TR2_XDEC through wiring lines M24 and M25 and contacts CNT27 and CNT28. In this manner, an electrical path that couples the electrode layer 20a and the second transistor TR2_XDEC may be configured. While FIG. 22 illustrates, for the sake of simplicity in illustration, only one of each of the contacts CNT26, CNT27 and CNT28 and the wiring lines M24 and M25, it should be understood that each of the contacts CNT26, CNT27 and CNT28 and the wiring lines M24 and M25 is provided in a plural number.

Figure 23:
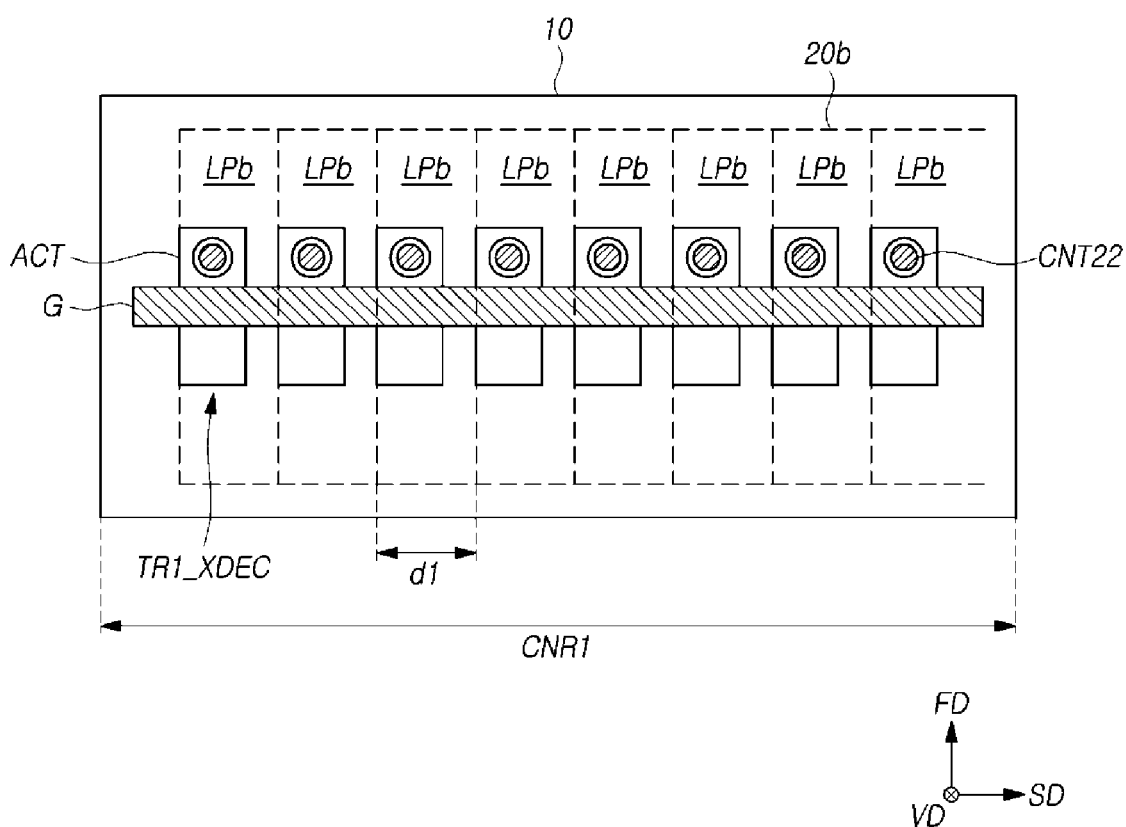
FIG. 23 is a top view illustrating a representation of an example of main component elements of a first coupling region of FIG. 22.

FIG. 23 is a top view illustrating a representation of an example of main component elements of a first coupling region of FIG. 22.

Referring to FIG. 23, from a top view, the pad parts LPb of the electrode layers 20b may be arranged in the second direction SD. Each of the pad parts LPb may have a first length dl in the second direction SD.

Active regions ACT, which are delimited by an isolation layer, may be defined in the substrate 10. The active regions ACT may be arranged in the second direction SD. A gate G, which extends in the second direction SD and traverses the active regions ACT, may be defined on the substrate 10. As the active region ACT is doped with impurities on both sides of the gate G, a drain region and a source region may be defined. A gate G, and a drain region and a source region on both sides of the gate G, may be included in a first transistor TR1_XDEC.

The first transistors TR1_XDEC may be disposed at a constant pitch in the second direction SD. The pitch of the first transistors TR1_XDEC may be defined as the sum of the width of one active region ACT in the second direction SD and the interval between adjacent edges of neighboring active regions ACT in the second direction SD. The pitch of the first transistors TR1_XDEC may be substantially the same as the first length dl as the length of the pad part LPb in the second direction SD.

The contact CNT22 may overlap with the drain region of a corresponding first transistor TR1_XDEC in the vertical direction VD. As described above with reference to FIG. 22, the first transistor TR1_XDEC may be coupled to a corresponding pad part LPb through the contact CNT22. The first transistor TR1_XDEC may overlap with the corresponding pad part LPb in the vertical direction VD. By disposing the first transistor TR1_XDEC and the pad part LPb coupled to each other to overlap with each other in the vertical direction VD, the electrical path that couples the first transistor TR1_XDEC and the pad part LPb may be configured in the shape of a straight line. Therefore, the length of the electrical path may be minimized, which makes it possible to minimize the loading of the electrical path, thereby contributing to the improvement in the operational reliability of the memory device. In addition, it is possible to reduce area consumption due to the configuration of the electrical path, thereby contributing to the reduction in the size of the memory device.

As described above with reference to FIGS. 3 to 20, a memory device may include a small block and a large block. In some embodiments, the width of the large block in the first direction FD may be configured to be larger than the width of the small block in the first direction FD. In such embodiments, the number of large blocks included in the memory device may be less than the number of small blocks included therein. Therefore, as compared to embodiments in which all memory blocks are configured as small blocks, a small number of electrical paths will be required to couple word lines and a logic circuit. In the memory device in accordance with some embodiments of the disclosure, the number of electrical paths that couple word lines and a logic circuit may be reduced, thereby contributing to decreasing the complexity of wiring lines which configure the electrical paths and to easily designing the wiring lines.

FIGS. 24A to 24E are cross-sectional views illustrating representations of examples of steps of manufacturing a memory structure of the first wafer in accordance with the embodiment of the disclosure.

Referring to FIG. 24A, as the plurality of interlayer dielectric layers 22a and the plurality of dielectric layers 24a are alternately stacked on the substrate 12a, a pre-stack PS may be formed. Although not illustrated, the substrate 12a may be disposed on the logic structure P (see FIG. 22). The interlayer dielectric layers 22a and the dielectric layers 24a may be formed of different materials. The dielectric layers 24a, as sacrificial layers, may be formed of a material that has an etching selectivity with respect to the interlayer dielectric layers 22a. For example, the interlayer dielectric layers 22a may be formed of an oxide, and the dielectric layers 24a may be formed of a nitride.

A mask pattern PR, which exposes a portion of the second coupling region CNR2, may be formed on the pre-stack PS. The pre-stack PS may be etched by a pad etching process using the mask pattern PR as an etch mask. An etching thickness of the pad etching process may correspond to a vertical pitch of the interlayer dielectric layers 22a. The vertical pitch of the interlayer dielectric layers 22a may be defined as the sum of the thickness of one interlayer dielectric layer 22a and the thickness of one dielectric layer 24a.

A trimming process may be performed on the mask pattern PR. Namely, isotropic etching may be performed on the mask pattern PR. The trimming process may be performed using an etchant capable of removing the mask pattern PR. Accordingly, the height and the width of the mask pattern PR may be reduced. As the width of the mask pattern PR is reduced, the area of the second coupling region CNR2 exposed by the mask pattern PR may be increased. The pad etching process and the trimming process may constitute one cycle for forming one step in the second coupling region CNR2.

Referring to FIG. 24B, as the cycle is repeated a multitude of times, a step structure may be formed in the pre-stack PS in the second coupling region CNR2. The step structure may have a plurality of steps corresponding to the plurality of dielectric layers 24a, respectively. The mask pattern PR may be formed of a photoresist, and may be removed after the step structure is formed.

Referring to FIG. 24C, a dielectric layer 31, which covers the pre-stack PS, may be formed on the substrate 12a. Slits, which pass through the dielectric layer 31 and the pre-stack PS in the vertical direction VD, may be formed at the peripheries of the first coupling region CNR1, and a sidewall dielectric layer 40 may be formed by filling the slits.

The sidewall dielectric layer 40, which serves as an etch barrier in a process of subsequently removing the dielectric layers 24a, may be formed of a material that has an etching selectivity with respect to the dielectric layers 24a. For example, in the case where the dielectric layers 24a are formed of a nitride, the sidewall dielectric layer 40 may be formed of an oxide.

The plurality of vertical channels CHa, which pass through the dielectric layer 31 and the pre-stack PS in the vertical direction VD, may be defined in the first and second cell regions CAR1 and CAR2. The order of the process of forming the sidewall dielectric layer 40 and the process of forming the vertical channels CHa may be reversed.

Referring to FIG. 24D, an etching process for removing the dielectric layers 24a may be performed. For the etching process, an etchant capable of removing the dielectric layers 24a may be introduced. As the sidewall dielectric layer 40 serves as an etch barrier during the etching process, the dielectric layers 24a of the first coupling region CNR1 may not be removed but remain, and the dielectric layers 24a of the first and second cell regions CAR1 and CAR2 and the second coupling region CNR2 may be removed to create empty spaces.

As the empty spaces are created due to the removal of the dielectric layers 24a, the structural stability of the pre-stack PS may be degraded. The dielectric layers 24a that remain in the first coupling region CNR1 may support the interlayer dielectric layers 22a to increase structural stability to prevent the bending or collapse of the pre-stack PS.

Referring to FIG. 24E, the electrode layers 24a may be defined by filling a conductive material in the spaces from which the dielectric layers 24a are removed. The conductive material may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

FIG. 25 is a cross-sectional view illustrating a representation of an example of another coupling structure between row lines and a row decoder of the memory device in accordance with the embodiment of the disclosure.

Referring to FIG. 25, a plurality of cell regions CAR and a plurality of coupling regions CNR may be alternately disposed in the second direction SD. Each of the coupling regions CNR may be divided into a first coupling region CNR1 and a second coupling region CNR2. The first coupling region CNR1 and the second coupling region CNR2 that are included in one coupling region CNR may be disposed adjacent to each other in the second direction SD.

A plurality of electrode layers 20a and a plurality of interlayer dielectric layers 22a may be alternately stacked on a substrate 12a of the first wafer W1 in the cell regions CAR and the second coupling regions CNR2. A plurality of vertical channels CHa that pass through the electrode layers 20a and the interlayer dielectric layers 22a, alternately stacked, in the vertical direction VD may be defined in the cell regions CAR.

Each of the electrode layers 20a may have a pad part LPa. A contact CNT31 may be coupled to the pad part LPa. While FIG. 25 illustrates, for the sake of simplicity in illustration, a limited number of contacts CNT31 coupled to pad parts LPa, it should be understood that a contact CNT31 is coupled to each of the pad parts LPa of the electrode layers 20a.

The pad parts LPa of the electrode layers 20a may be disposed in the second coupling regions CNR2. The pad parts LPa of the electrode layers 20a may be grouped into a plurality of groups according to the distance between the pad part LPa and the substrate 12a, with each group disposed in a different second coupling region CNR2. For example, the pad parts LPa of the electrode layers 20a may be grouped into pad parts LPa of electrode layers 20a that are positioned relatively close to the substrate 12a in the vertical direction and pad parts LPa of electrode layers 20a which are positioned relatively far from the substrate 12a in the vertical direction. In FIG. 25, the pad parts LPa of the electrode layers 20a that are positioned relatively close to the substrate 12a may be disposed in one of the second coupling regions CNR2 (e.g., positioned to the left in FIG. 25), while the pad parts LPa of the electrode layers 20a that are positioned relatively farther away from the substrate 12a may be disposed in the other second coupling region CN2 (e.g., positioned to the right in FIG. 25).

In each second coupling region CNR2, as the pad parts LPa of the electrode layers 20a are staggered relative to one another, a step structure may be configured. The number of the pad parts LPa disposed in one second coupling region CNR2 may be less than the stack number of the electrode layers 20a.

In each of the first coupling regions CNR1, as a plurality of dielectric layers 24a and a plurality of interlayer dielectric layers 22a are alternately stacked on the substrate 12a of the first wafer W1, a dielectric stack may be configured. The dielectric layers 24a may be disposed at the same layers as the electrode layers 20a, respectively. The dielectric layers 24a may have the same thickness as the electrode layers 20a that are disposed in the same layer. The dielectric layers 24a may be formed of a dielectric material that has an etching selectivity with respect to the interlayer dielectric layers 22a. For example, in the case where the interlayer dielectric layers 22a are formed of silicon oxide, the dielectric layers 24a may be formed of silicon nitride.

A plurality of electrode layers 20b and a plurality of interlayer dielectric layers 22b may be alternately stacked on a substrate 12b of the second wafer W2. A plurality of vertical channels CHb, which pass through the electrode layers 20b and the interlayer dielectric layers 22b, alternately stacked, in the vertical direction VD may be defined in the cell regions CAR.

Each of the electrode layers 20b may have a pad part LPb. A contact CNT32 may be coupled to the pad part LPb. In each first coupling region CNR1, as the pad parts LPb of the electrode layers 20b are staggered with one another, a step structure may be configured. While FIG. 25 illustrates, for the sake of simplicity in illustration, a limited number of contacts CNT32 coupled to pad parts LPb from among the pad parts LPb of the electrode layers 20b, it should be understood that a contact CNT32 is coupled to each of the pad parts LPb of the electrode layers 20b.

The pad parts LPb of the electrode layers 20b may be disposed in the plurality of first coupling regions CNR1. The pad parts LPb of the electrode layers 20b may be grouped into a plurality of groups according to the distance between the pad part LPb and the substrate 12b, with each group disposed in a different first coupling region CNR1. For example, the pad parts LPb of the electrode layers 20b may be grouped into pad parts LPb of lower electrode layers 20b that are positioned relatively close to the substrate 12b in the vertical direction VD and pad parts LPb of upper electrode layers 20b which are positioned relatively far from the substrate 12b in the vertical direction VD. In FIG. 25, the pad parts LPb of the electrode layers 20b that are positioned relatively close to the substrate 12b may be disposed in one of the first coupling regions CNR1 (e.g., positioned to the left in FIG. 25), and the pad parts LPb of the electrode layers 20b that are positioned relatively farther away from the substrate 12b may be disposed in the other first coupling region CN1 (e.g., positioned to the right in FIG. 25).

In each first coupling region CNR1, as the pad parts LPb of the electrode layers 20b are staggered relative to one another, a step structure may be configured. The number of the pad parts LPb disposed in one first coupling region CNR1 may be less than the stack number of the electrode layers 20b. In each of the plurality of first coupling regions CNR1, the pad parts LPb of the electrode layers 20b may overlap with the insulation stack (configured by the plurality of dielectric layers 24a and the plurality of interlayer dielectric layers 22a alternately stacked) in the vertical direction VD.

A plurality of first transistors TR1_XDEC and a plurality of second transistor TR2_XDEC may be defined on the substrate 10 of the logic structure P. The plurality of first transistors TR1_XDEC may be pass transistors for transferring an operating voltage to the electrode layers 20b of the second wafer W2, and the plurality of second transistors TR2_XDEC may be pass transistors for transferring an operating voltage to the electrode layers 20a of the first wafer W1. The first transistors TR1_XDEC and the second transistors TR2_XDEC illustrated in FIG. 25 may configure a row decoder.

In the first coupling regions CNR1, a plurality of bonding pads PAD3 corresponding to the first transistors TR1_XDEC, respectively, may be defined on the one surface of the first wafer W1, which is bonded to the second wafer W2. The bonding pad PAD3 may be coupled to a corresponding first transistor TR1_XDEC through contacts CNT33, CNT34 and CNT35 and wiring lines M31 and M32. The contact CNT34 may pass through the insulating stack in each of the plurality of first coupling regions CNR1 in the vertical direction VD.

In the first coupling regions CNR1, a plurality of bonding pads PAD4 corresponding to the pad parts LPb of the electrode layers 20b, respectively, may be defined on the one surface of the second wafer W2 bonded to the first wafer W1. The bonding pad PAD4 may be coupled to the pad part LPb of a corresponding electrode layer 20b through contacts CNT36 and CNT32 and a wiring line M33. The bonding pads PAD4 of the second wafer W2 may be bonded to the bonding pads PAD3 of the first wafer W1, respectively. According to this fact, electrical paths that couple the electrode layers 20b and the first transistors TR1_XDEC may be configured.

The contacts CNT31 may be coupled to the pad parts LPa of the electrode layers 20a, respectively, in the second coupling regions CNR2. A wiring line M34 may be coupled to the top end of the contact CNT31. The wiring line M34 may extend from the second coupling region CNR2 to the adjacent first coupling region CNR1. In the first coupling region CNR1, the wiring line M34 may be coupled to the contact CNT37. The contact CNT37 may pass through the plurality of dielectric layers 24a and the plurality of interlayer dielectric layers 22a, alternately stacked, in the vertical direction VD in the first coupling region CNR1. The contact CNT37 may be coupled to the second transistor TR2_XDEC through a wiring line M35 and a contact CNT38.

For the sake of simplicity in illustration, FIG. 25 illustrates only the first transistors TR1_XDEC and the electrical paths that are coupled to some of the electrode layers 20b, but it should be understood that a first transistor TR1_XDEC and an electrical path are provided for each of the electrode layers 20b. For the sake of simplicity in illustration, FIG. 25 illustrates only the second transistors TR2_XDEC and the electrical paths that are coupled to some of the electrode layers 20a, but it should be understood that a second transistor TR2_XDEC and an electrical path are provided for each of the electrode layers 20a.

When the memory device operates, a high-level operating voltage may be provided to the electrode layers 20a and 20b. In order to transfer the high voltage, the first and second transistors TR1_XDEC and TR2_XDEC should have a large size capable of withstanding the high voltage. Therefore, the first and second transistors TR1_XDEC and TR2_XDEC may be disposed in the lengthwise direction, i.e., in the second direction SD.

As a measure for increasing integration, the sizes of the pad parts LPa and LPb are decreasing. If the pad parts LPa and LPb are densely disposed in one region, then due to the mismatch between the sizes of the pad parts LPa and LPb and the sizes of the first and second transistors TR1_XDEC and TR2_XDEC, a difference in length between the electrical paths for coupling the pad parts LPa and LPb and the first and second transistors TR1_XDEC and TR2_XDEC, respectively, may be large. If the deviation in length between the electrical paths is large, then a difference in loading between the electrical paths increases, whereby the operational reliability of the memory device may be degraded.

According to the present embodiment, the pad parts LPa of the electrode layers 20a are disposed in a distributed manner in a plurality of regions, and the pad parts LPb of the electrode layers 20b are disposed in a distributed manner in a plurality of regions. Consequently, differences in length between the electrical paths for coupling the pad parts and the transistors may be reduced. Therefore, a difference in loading between the electrical paths is reduced, which makes it possible to contribute to improving the operational reliability of the memory device.

Figure 26A:
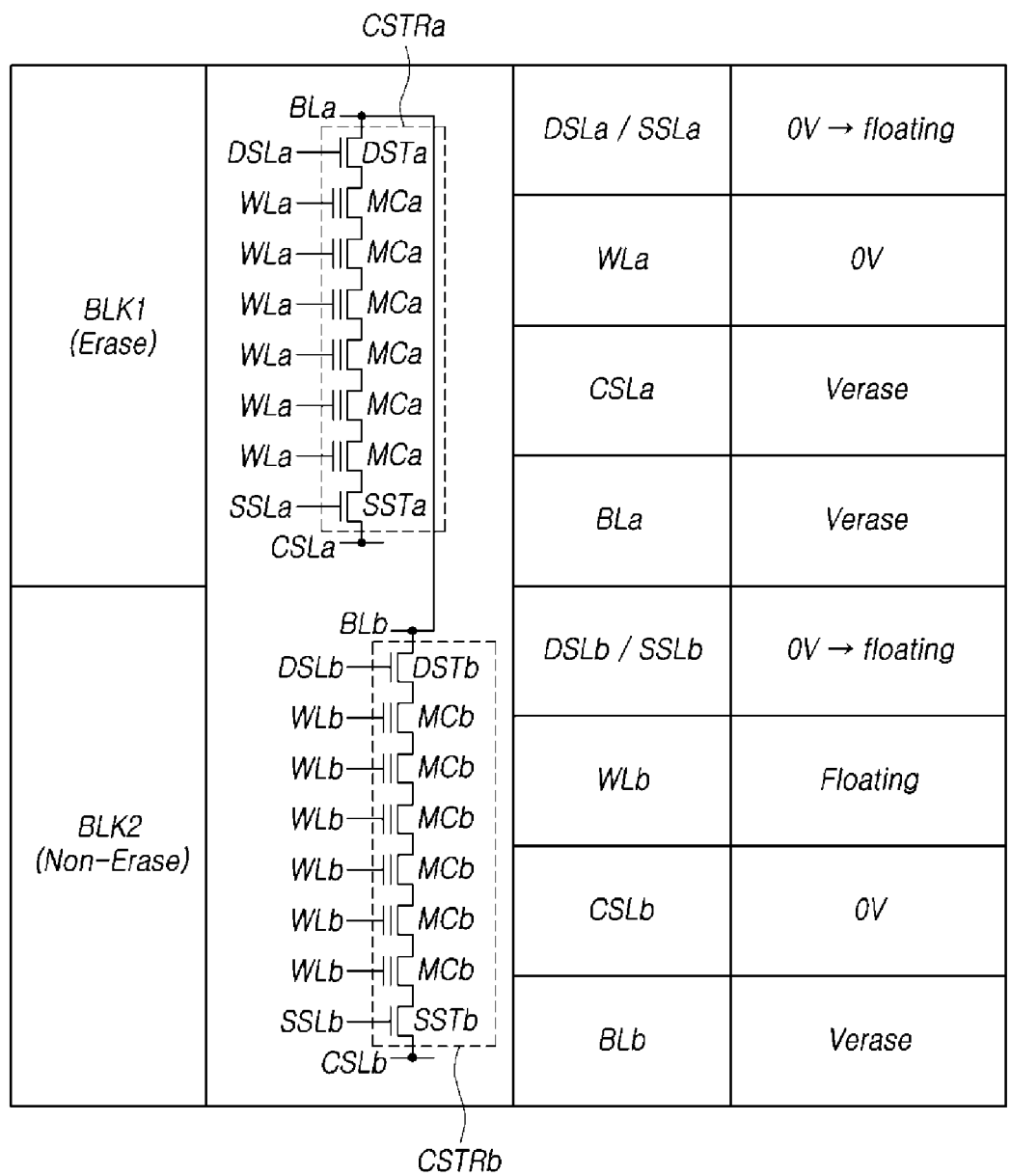
FIGS. 26A and 26B are tables showing representations of examples of bias conditions in an erase operation of the memory device in accordance with the embodiment of the disclosure.
Figure 26B:
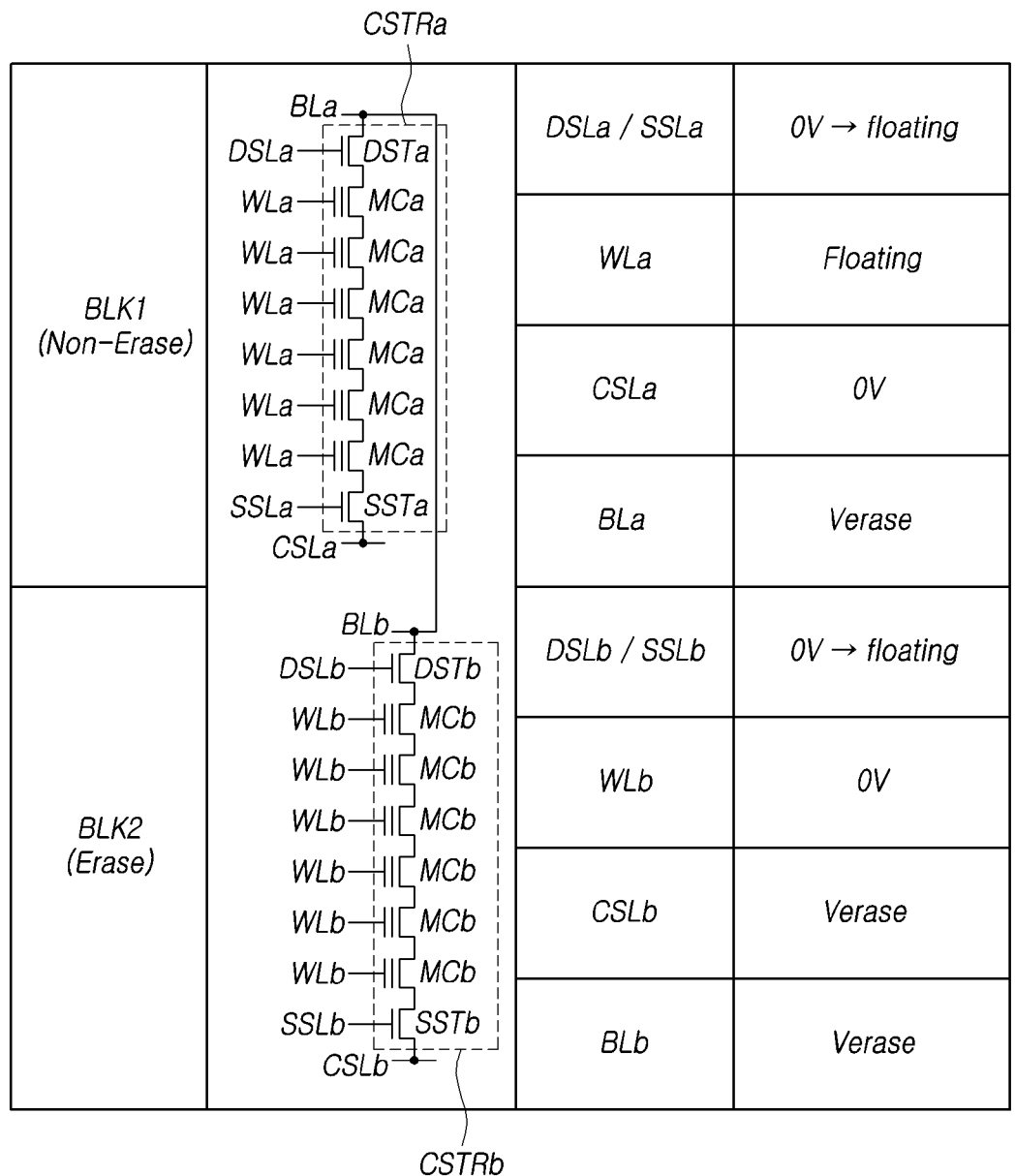

FIGS. 26A and 26B are tables showing representations of examples of bias conditions in an erase operation of the memory device in accordance with the embodiment of the disclosure. In detail, FIG. 26A shows a bias condition in an example of erasing only the first memory block BLK1, and FIG. 26B shows a bias condition in an example of erasing only the second memory block BLK2.

Referring to FIG. 26A, a ground voltage is applied to the drain select line DSLa and the source select line SSLa of the first memory block BLK1, and then, they are floated. A voltage of 0V is applied to the word lines WLa of the first memory block BLK1.

The ground voltage is applied to the drain select line DSLb and the source select line SSLb of the second memory block BLK2, and then, they are floated. The word lines WLb of the second memory block BLK2 are floated.

An erase voltage Verase is applied to the common source line CSLa and the bit lines BLa of the first memory block BLK1, and a voltage of 0V is applied to the common source line CSLb of the second memory block BLK2. Because the second bit lines BLb of the second memory block BLK2 are coupled to the first bit lines BLa of the first memory block BLK1, the erase voltage Verase is also applied to the second bit lines BLb of the second memory block BLK2.

Due to such bias, the potential of the channels of the cell strings CSTRa of the first memory block BLK1 and the potential of the channels of the cell strings CSTRb of the second memory block BLK2 rise to the level of the erase voltage Verase.

If the potential of the channels of the cell strings CSTRa of the first memory block BLK1 rises to the level of the erase voltage Verase, then as a difference between the potential of the channels and the potential (0V) of the word lines WLa becomes equal to or larger than a magnitude required for erasing memory cells, the memory cells MCa of the first memory block BLK1 are erased. On the other hand, if the potential of the channels of the cell strings CSTRb of the second memory block BLK2 rises to the level of the erase voltage Verase, then the potential of the word lines WLb of the second memory block BLK2, which is in the floating state, rises along with the potential of the channels by a coupling phenomenon. Accordingly, as a difference between the potential of the channels and the potential of the word lines WLb becomes smaller than a magnitude required for erasing memory cells, the memory cells MCb of the second memory block BLK2 are not erased.

An erase operation on the second memory block BLK2 is also similar to the erase operation on the first memory block BLK1.

Referring to FIG. 26B, a ground voltage is applied to the drain select line DSLa and the source select line SSLa of the first memory block BLK1, and then, they are floated. The word lines WLa of the first memory block BLK1 are floated. The ground voltage is applied to the drain select line DSLb and the source select line SSLb of the second memory block BLK2, and then, they are floated. A voltage of 0V is applied to the word lines WLb of the second memory block BLK2.

A voltage of 0V is applied to the common source line CSLa of the first memory block BLK1, and an erase voltage Verase is applied to the common source line CSLb and the bit lines BLb of the second memory block BLK2. Because the first bit lines BLa of the first memory block BLK1 are coupled to the second bit lines BLb of the second memory block BLK2, the erase voltage Verase is also applied to the first bit lines BLa of the first memory block BLK1.

Due to such bias, the potential of the channels of the cell strings CSTRa of the first memory block BLK1 and the potential of the channels of the cell strings CSTRb of the second memory block BLK2 rise.

If the potential of the channels of the cell strings CSTRa of the first memory block BLK1 rises to the level of the erase voltage Verase, then the potential of the word lines WLa of the first memory block BLK1, which is in the floating state, rises along with the potential of the channels by a coupling phenomenon. Accordingly, as a difference between the potential of the channels and the potential of the word lines WLa becomes smaller than a magnitude required for erasing memory cells, the memory cells MCa of the first memory block BLK1 are not erased. On the other hand, if the potential of the channels of the cell strings CSTRb of the second memory block BLK2 rises to the level of the erase voltage Verase, then as a difference between the potential of the channels and the potential (0V) of the word lines WLb becomes equal to or larger than a magnitude required for erasing memory cells, the memory cells MCb of the second memory block BLK2 are erased.

According to the erase biases described above, the first memory block BLK1 and the second memory block BLK2 having different sizes may be individually erased.

Figure 27:
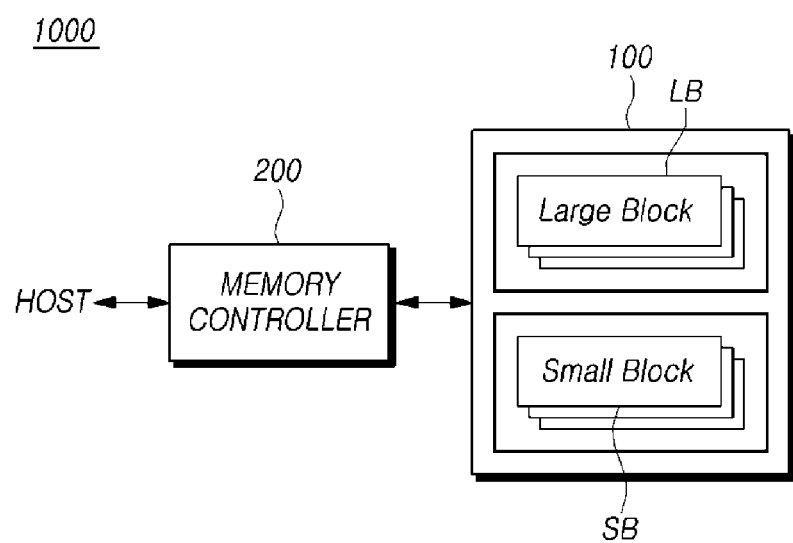
FIG. 27 is a schematic block diagram illustrating a representation of an example of a memory system in accordance with an embodiment of the disclosure.

FIG. 27 is a schematic block diagram illustrating a representation of an example of a memory system in accordance with an embodiment of the disclosure.

Referring to FIG. 27, a memory system 1000 in accordance with the embodiment of the disclosure may include a memory device 100 and a memory controller 200.

The memory device 100 may include a plurality of memory blocks, and may operate in response to the control of the memory controller 200. Operations of the memory device 100 may include, for example, a read operation, a write operation (also referred to as a program operation) and an erase operation.

The memory blocks of the memory device 100 may include a plurality of large blocks LB and a plurality of small blocks SB. As described above with reference to FIGS. 3 to 20, the large blocks LB and the small blocks SB may be defined in different wafers. For example, the small blocks SB may be defined in a first wafer, and the large blocks LB may be defined in a second wafer.

The memory device 100 may be configured to receive a command, an address and so forth from the memory controller 200 and access a region in the memory cell array, which is selected by the address. In other words, the memory device 100 may perform an operation corresponding to the command, on the region selected by the address. For example, the memory device 100 may perform a write operation, a read operation and an erase operation. In this connection, in the write operation, the memory device 100 may program data to an area selected by the address. In the read operation, the memory device 100 may read data from the region selected by the address. In the erase operation, the memory device 100 may erase data stored in the region selected by the address.

The memory controller 200 may control write (program), read, erase and background operations on the memory device 100. For example, the background operation may include at least one among a garbage collection (GC) operation, a wear leveling (WL) operation, a bad block management (BBM) operation, and so forth.

The memory controller 200 may control the operation of the memory device 100 according to a request of a host. Alternatively, the memory controller 200 may control the operation of the memory device 100 regardless of a request of the host. The memory controller 200 and the host may be devices that are separated from each other. The memory controller 200 and the host may be implemented by being integrated into one device. Hereunder, for the sake of convenience in explanation, it will be described, as an example, that the memory controller 200 and the host are devices separated from each other.

A flash memory has a certain level of lifetime that may be determined based on the number of write/erase times. The flash memory cannot perform an overwrite operation due to the physical characteristics thereof. That is to say, in the flash memory, when a write operation is to be performed on a memory block that is written with data, an erase operation should be performed on the memory block before the write operation is performed. Due to such characteristics of the flash memory, a system software called a flash translation layer (hereinafter referred to as "FTL") is used between the file system of the host and the memory device 100.

The flash translation layer (FTL) may provide interfacing for hiding the erase operation of the flash memory between the file system of the host and the memory device 100. The disadvantage of the flash memory device, such as erase-before-write and mismatch between an erase unit and a write unit, may be solved by the flash translation layer (FTL). The flash translation layer (FTL) maps a logical address, generated by the file system, to a physical address of the memory device 100 during a write operation of the memory device 100. The flash translation layer (FTL) driven by the memory controller 200 may map addresses according to a log mapping method. However, the advantages of the disclosure may be applied to various address mapping methods as well as the log mapping method.

The memory controller 200 may allocate a log block by referring to the size of inputted data. In particular, the memory controller 200 may allocate a log block in units of small blocks SB or in units of large blocks LB by referring to the size of data. Hereinafter, allocating memory blocks existing in a free block pool as log blocks and allocating the memory blocks existing in the free block pool as data blocks will have a similar meaning. Therefore, allocating a memory block selected from the free block pool as a log block means that the memory block selected from the free block pool may also be allocated as a data block.

As described above, the memory device 100 is configured by a plurality of memory blocks, and each memory block is composed of a plurality of pages. For example, one memory block may be composed of 64 or 128 pages. The memory device 100 performs write and read operations on a page basis, and performs an erase operation on a memory block basis. The speeds of the respective operations are different from one another. For example, the speed of the read operation is about twenty-five microseconds (25 µs), the speed of the write operation is about two hundred and fifty microseconds (250 µs), and the speed of the erase operation is about two thousand microseconds (2,000 µs), and thus, the speeds of the respective operations are asymmetric. In particular, the speed of the erase operation is much slower than the speeds of the read operation and the write operation. The speed of the erase operation decreases as the size of a memory block increases. The slow erase operation is a major cause for degradation in the performance of the memory device 100.

According to the erase bias shown in FIGS. 26A and 26B, the memory device 100 in accordance with embodiments of the disclosure may be erased in small block units or large block units. Hence, the memory controller 200 may allocate log blocks in small block units or large block units.

If a small block existing in a free block pool is allocated as a log block, then the allocated log block may be erased through an erase-before-write operation. According to embodiments of the disclosure, memory blocks may be erased in small block units, which makes it possible to contribute to improving the performance of the memory blocks through reduction in erase time.

Figure 28:
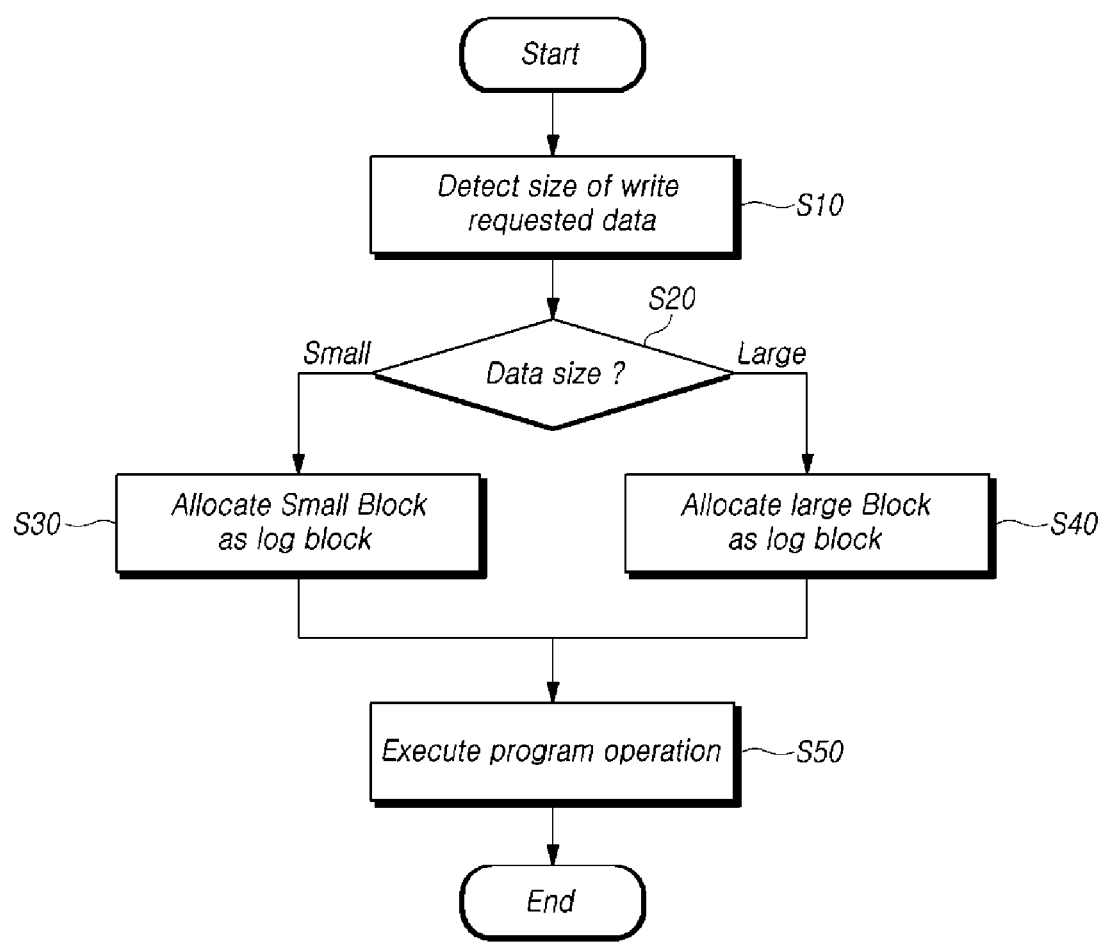
FIG. 28 is a representation of an example of a flow chart to assist in the explanation of a write method in accordance with an embodiment of the disclosure.

FIG. 28 is a representation of an example of a flow chart to assist in the explanation of a write method in accordance with an embodiment of the disclosure.

Referring to FIG. 28, at step S10, a memory controller may detect the size of write-requested data.

At step S20, when it is determined that the detected size of the data is smaller than a reference size (for example, 30 MB), that is, the data is small-sized data, the process proceeds to step S30. On the other hand, when it is determined that the write-requested data has a size equal to or larger than the reference size, that is, the data is large-sized data, the process proceeds to step S40.

At the step S30, a small block is allocated as a log block. That is to say, in the case where the write-requested data is of a small size, a small block among memory blocks existing in a free block pool is provided as a log block. If the log block allocation is completed, then the process proceeds to step S50 for programming the data in the allocated log block.

At the step S40, a large block is allocated as a log block. That is to say, in the case where the write-requested data is of a large size, a large block among memory blocks existing in the free block pool is provided as a log block. If the log block allocation is completed, then the process proceeds to the step S50 for programming the data in the allocated log block.

At the step S50, the memory controller programs the write-requested data to the allocated small block or large block. An erase operation may be performed on the allocated memory block before the data is programmed. If the program of the write data is completed, a program cycle corresponding to one write request ends.

According to the present embodiment, if the write-requested data has a small size, not a large block but a small block is allocated. Therefore, it is possible to reduce write amplification, thereby contributing to improving memory utilization efficiency. In addition, if the write-requested data has a small size, by allocating not a large block but a small block, it is possible to reduce a time required for an erase-before-write operation, thereby contributing to improving the performance of the memory device.

FIGS. 29A to 29D are representations of examples of diagrams to assist in the explanation of a memory block management method in accordance with an embodiment of the disclosure.

Figure 29A:
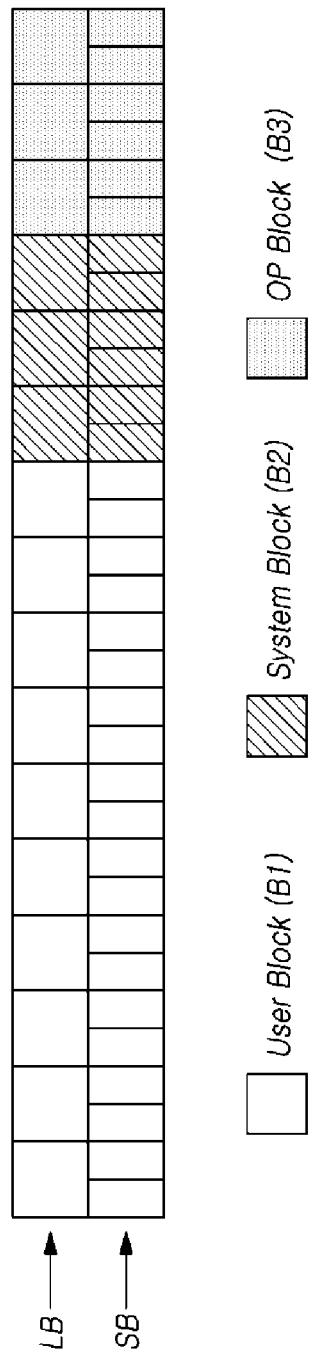
FIGS. 29A to 29D are representations of examples of diagrams to assist in the explanation of a memory block management method in accordance with an embodiment of the disclosure.
Figure 29B:
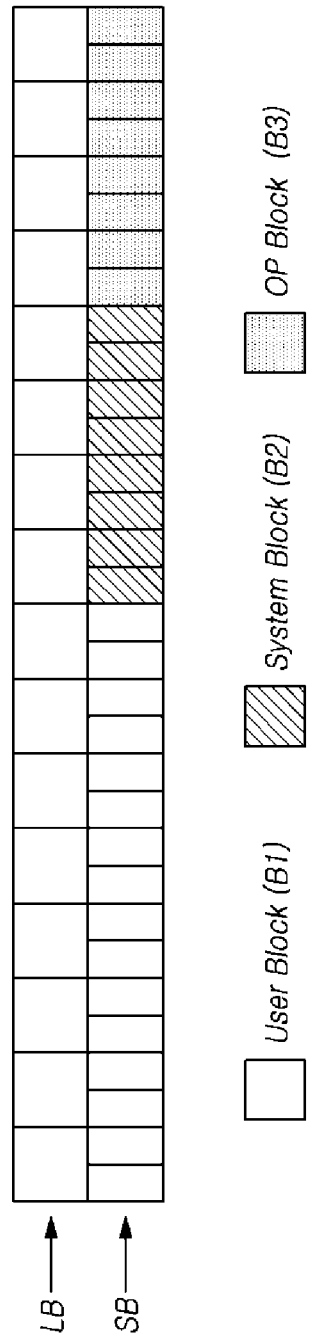
Figure 29C:
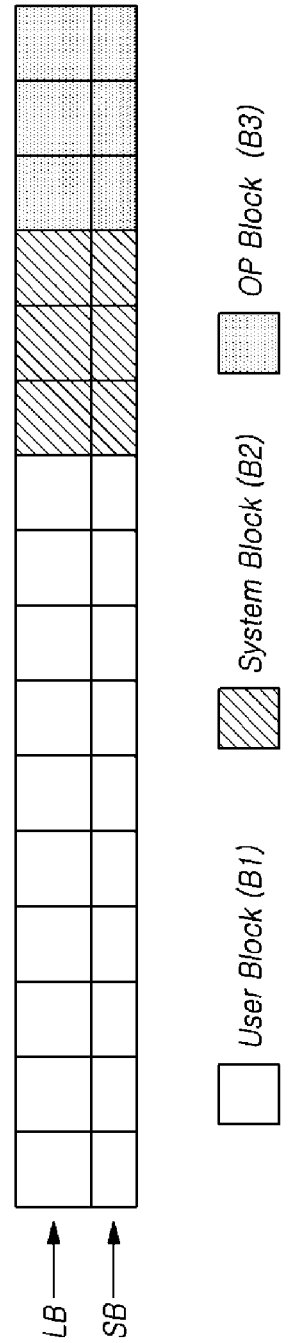
Figure 29D:
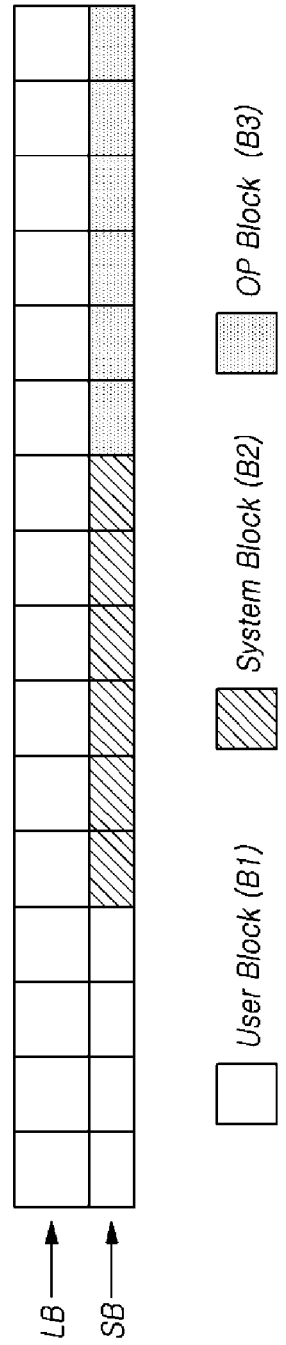

Referring to FIGS. 29A to 29D, a memory device may include a plurality of memory blocks B1, B2 and B3. A memory block may be classified as a large block LB or a small block SB. FIGS. 29A and 29B illustrate an example of classifying memory blocks into a small block SB and a large block LB based on the number of cell strings included in each memory block, and FIGS. 29C and 29D illustrate an example of classifying memory blocks into a small block SB and a large block LB based on the stack number of word lines included in each memory block.

A memory may be classified into a user region, a system region and an over-provisioning (OP) region depending on the type of data to be stored therein. A user block B1 represents the memory block of the user region, a system block B2 represents the memory block of the system region, and an OP block B3 represents the memory block of the over-provisioning region.

Data write-requested by a host may be stored in the user block B1. The user block B1 may be classified into a free block or a data block depending on whether data is stored. The free block represents a block in which data is not stored and which is empty, and the data block represents a block in which data is stored. Although not illustrated, a bad block is a memory block in which data cannot be stored. The bad block may be classified into a manufacture bad block (MBB), which occurs during the manufacture of the memory device, and a growing bad block (GBB), which occurs in the process of using the memory block, depending on a point of time at which the back block is produced.

System information may be stored in the system block B2. The system information may be map data for mapping information between logical addresses and physical addresses, booting information on information necessary for a boot operation of a storage device, and setting information used for an operation of a firmware of the memory controller.

The over-provisioning block B3 may be a reserved space allocated to allow various functions required for driving the memory device, such as wear leveling, garbage collection and bad block management, to operate smoothly.

In general, the size of user data that is randomly made by a user on a mobile is not constant. For example, the size of one memory block may be 100 MB, and the user may generate and store data of 1 MB. In this case, as the remaining space corresponding to 99 MB becomes useless (write amplification), memory efficiency is degraded. However, not all sizes of user data are small. In recent years, the number of pixels of a camera is being increased, and thus, large-sized image data may be stored. Meanwhile, a large amount of data is mainly stored in an eSSD (enterprise Solid State Drive).

FIGS. 29A and 29C are diagrams illustrating a memory block management method of a memory device used in a mobile device, and FIGS. 29B and 29D are diagrams illustrating a memory block management method of a memory device used in an eSSD.

Referring to FIGS. 29A and 29C, if the memory device used in a mobile device, because the sizes of write-requested data vary, the memory controller may configure a proportion occupied by small blocks SB and a proportion occupied by large blocks LB, from among user blocks B1 managed as a user region, to be the same as or similar to each other. For example, half of the user blocks B1 managed as the user region may be small blocks SB, and the other half may be large blocks LB. Further, system blocks B2 and over-provisioning blocks B3 may be configured using the remaining blocks, except for the user blocks B1.

Referring to FIGS. 29B and 29D, if the memory device used in an eSSD, because most of the sizes of write-requested data are large, all large blocks LB may be managed as the user region. The system region and the over-provisioning region may be managed to be configured in small blocks SB. In addition, small blocks SB may remain after the system region and the over-provisioning region are configured, and the remaining small blocks SB may be managed as the user region.

Figure 30:
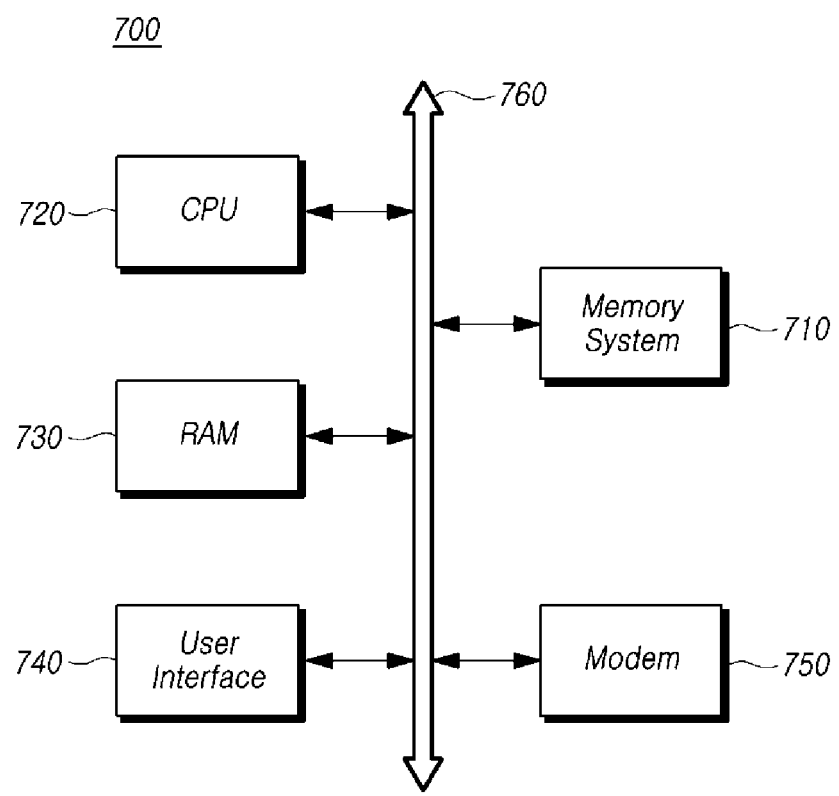
FIG. 30 is a block diagram schematically illustrating a representation of an example of a computing system including a memory device in accordance with an embodiment of the disclosure.

FIG. 30 is a block diagram schematically illustrating a representation of an example of a computing system including a memory device in accordance with an embodiment of the disclosure.

Referring to FIG. 30, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A memory device comprising:
a first wafer including a first substrate, a plurality of first electrode layers and a plurality of first interlayer dielectric layers alternately stacked along first vertical channels projecting in a vertical direction on a top surface of the first substrate, and a dielectric stack comprising a plurality of dielectric layers and the plurality of first interlayer dielectric layers alternately stacked on the top surface of the first substrate; and
a second wafer disposed on the first wafer, and including a second substrate, and a plurality of second electrode layers that are alternately stacked with a plurality of second interlayer dielectric layers along second vertical channels projecting in the vertical direction on a bottom surface of the second substrate and have pad parts overlapping with the dielectric stack in the vertical direction.

2. The memory device according to claim 1, wherein the plurality of dielectric layers are formed of a material that has an etching selectivity different from that of the plurality of first interlayer dielectric layers.

3. The memory device according to claim 1, wherein the pad parts of the plurality of second electrode layers are staggered to form a step structure.

4. The memory device according to claim 1, further comprising:
a plurality of contacts electrically coupled to the plurality of second electrode layers, respectively, and passing through the dielectric stack in the vertical direction.

5. The memory device according to claim 4, wherein the first wafer further includes a logic circuit that is defined on a third substrate below the first substrate and that is coupled to the plurality of second electrode layers through the plurality of contacts.

6. The memory device according to claim 5, further comprising:
a plurality of first slits dividing the plurality of first electrode layers and the plurality of first interlayer dielectric layers alternately stacked, into first memory block units; and
a plurality of second slits dividing the plurality of second electrode layers and the plurality of second interlayer dielectric layers alternately stacked, into second memory block units, wherein an interval between neighboring first slits is narrower than an interval between neighboring second slits.

7. The memory device according to claim 5, further comprising:
a plurality of first slits dividing the plurality of first electrode layers and the plurality of first interlayer dielectric layers alternately stacked, into first memory block units; and
a plurality of second slits dividing the plurality of second electrode layers and the plurality of second interlayer dielectric layers alternately stacked, into second memory block units,
wherein an interval between neighboring first slits is wider than an interval between neighboring second slits.

8. The memory device according to claim 5, wherein a stack number of the plurality of first electrode layers is less than a stack number of the plurality of second electrode layers.

9. The memory device according to claim 5, wherein a stack number of the plurality of first electrode layers is greater than a stack number of the plurality of second electrode layers.

10. The memory device according to claim 1, wherein the pad parts of the plurality of second electrode layers are disposed in a plurality of coupling regions, and are grouped into a plurality of groups such that pad parts of different groups are disposed in different coupling regions.

11. The memory device according to claim 10, wherein, in each of the plurality of coupling regions, the pad parts of the plurality of second electrode layers are staggered with one another to form a step structure.

12. The memory device according to claim 1,
wherein each of the plurality of first electrode layers includes a pad part, and
wherein pad parts of the plurality of first electrode layers are disposed in a plurality of coupling regions, and are grouped into a plurality of groups such that pad parts of different groups are disposed in different coupling regions.

13. The memory device according to claim 12, wherein, in each of the plurality of coupling regions, the pad parts of the plurality of first electrode layers are staggered with one another to form a step structure.

14. The memory device according to claim 12, further comprising:
a plurality of contacts, electrically coupled to the plurality of first electrode layers, respectively, and passing through the dielectric stack in the vertical direction.

* * * * *